United States Patent
Mohammadi et al.

(10) Patent No.: US 8,054,145 B2
(45) Date of Patent: Nov. 8, 2011

(54) PHONONIC CRYSTAL WAVE STRUCTURES

(75) Inventors: Saeed Mohammadi, Atlanta, GA (US); Ali Ashgar Eftekhar, Atlanta, GA (US); Ali Adibi, Suwanee, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 206 days.

(21) Appl. No.: 12/433,888

(22) Filed: Apr. 30, 2009

(65) Prior Publication Data
US 2009/0295505 A1  Dec. 3, 2009

Related U.S. Application Data

(60) Provisional application No. 61/049,003, filed on Apr. 30, 2008.

(51) Int. Cl.
*H03H 9/00* (2006.01)
*H01P 3/12* (2006.01)

(52) U.S. Cl. .......................................... 333/186; 333/248

(58) Field of Classification Search .................. 333/186, 333/187, 248; 29/25.35
See application file for complete search history.

(56) References Cited

U.S. PATENT DOCUMENTS

| | | | |
|---|---|---|---|
| 4,150,346 A | 4/1979 | Auld | |
| 6,909,221 B2 | 6/2005 | Ayazi et al. | |
| 7,057,476 B2 | 6/2006 | Hwu | |
| 7,292,740 B1 | 11/2007 | Barker et al. | |
| 7,733,198 B1 * | 6/2010 | Olsson et al. | ................ 333/187 |
| 7,836,566 B1 * | 11/2010 | Olsson et al. | ................ 29/25.35 |
| 7,859,350 B1 * | 12/2010 | Schwindt et al. | ............ 331/94.1 |
| 2008/0283765 A1 | 11/2008 | Hyde et al. | |

FOREIGN PATENT DOCUMENTS

WO   2008100901 A1   8/2008

OTHER PUBLICATIONS

Qiu et al., Mode-selecting acoustic filter by using resonant tunneling of two-dimensional double phononic crystals, Aug. 2005, Applied Physics 87, 3 pages.*
Luk et al., Photonic and phononic crystal research at Sandia, Apr. 2007, QMPH, 26 pages.*
Luk et al., Photonic and phononic crystal research at Sandia, Apr. 2007, QMPH, 4 pages.*

(Continued)

*Primary Examiner* — Dean Takaoka
(74) *Attorney, Agent, or Firm* — Ryan A. Schneider, Esq.; Dustin B. Weeks, Esq.; Troutman Sanders LLP

(57) ABSTRACT

Phononic crystal wave structures and methods of making same are discussed in this application. According to some embodiments, an acoustic structure can generally comprise a phononic crystal slab configured as a micro/nano-acoustic wave medium. The phononic crystal slab can define an exterior surface that bounds an interior volume, and the phononic crystal slab can be sized and shaped to contain acoustic waves within the interior volume of the phononic crystal slab. The phononic crystal slab can comprise at least one defect portion. The defect portion can affect periodicity characteristics of the phononic crystal slab. The defect portion can be shaped and arranged to enable confinement and manipulation of acoustic waves through the defect portion(s) of phononic crystal slab. Other aspects, features, and embodiments are also claimed and described.

31 Claims, 15 Drawing Sheets

OTHER PUBLICATIONS

Mohammadi, S., et al., Complete Phononic Bandgaps and Bandgap Maps in Two-Dimensional Silicon Phononic Crystal Plates, Electronics Letters, vol. 43, No. 16 (Aug. 7, 2007).

Sigalas, M.M., et al., Elastic and Acoustic Wave Band Structure, Journal of Sound and Vibration (1992) 158(2), 377-382.

Kushwaha, M.S., et al., Acousting Band Structure of Periodic Elastic Composites, Physical Review Letters, vol. 71, No. 13, pp. 2022-2025, Sep. 27, 1993.

Khelif, A., et al., Complete Band Gaps in Two-Dimensional Phononic Crystal Slabs, Physical Review E, 74, 046610-1-046610-4, Oct. 17, 2006.

Zhang, X., et al., Evidence of surface acoustic wave band gaps in the phononic crystals created on thin plates, Applied Physics Letters 88, 041911-1-041911-3, Jan. 25, 2006.

Tanaka, Y., Acoustic stop bands of surface and bulk modes in two-dimensional phononic lattices consisting of aluminum and a polymer, Physical Review B, vol. 60, No. 19, pp. 13 294-13 297, Nov. 15, 1999.

Meseguer, F., et al., Two-Dimensional Elastic Bandgap Crystal to Attenuate Surface Waves, Journal of Lightwave Technology, vol. 17, No. 11, pp. 2196-2201, Nov. 1999.

Benchabane, S., et al., Evidence for complete surface wave band gap in a piezoelectric phononic crystal, Physical Review E 73, 065601-1-065601-4, Jun. 9, 2006.

Sun, J., et al., Propagation of surface acoustic waves through sharply bent two-dimensional phononic crystal waveguides using a finite-difference time-domain method, Physical Review B 74, 174305-1-174305-7, Nov. 30, 2006.

Khelif, A., et al., Waveguiding inside the complete band gap of a phononic crystal slab, Physical Review E 76, 056601-1 056601-6, Nov. 8, 2007.

Vasseur, J.O., et al., Waveguiding in two-dimensional piezoelectric phononic crystal plates, Journal of Applied Physics 101, 114904-1-114904-6, Jun. 5, 2007.

Olsson, III, Roy, et al., Microfabricated VHF acoustic crystals and waveguides, Sensors and Actuators A 145-146, pp. 87-93, Nov. 12, 2007.

El-Kady, I., et al., Phononic band-gap crystals for radio frequency communications, Applied Physics Letters 92, 233504-1-233504-3, Jun. 10, 2008.

Chang, LL., et al., Resonant Tunneling in Semiconductor Double Barriers, Applied Physics Letters, vol. 24, No. 12, pp. 593-595, Jun. 15, 1974.

Gorishnyy, T., et al., Phononic crystals are novel materials that offer exceptional control over phonons, sound and other mechanical waves, physicsworld.com, published Dec. 1, 2005 (accessed Apr. 15, 2005).

Vasseur, J., et al., Waveguiding in supported phononic crystal plates, Journal of Physics: Conference Series 92 (2007) 012111, pp, 1-4.

* cited by examiner

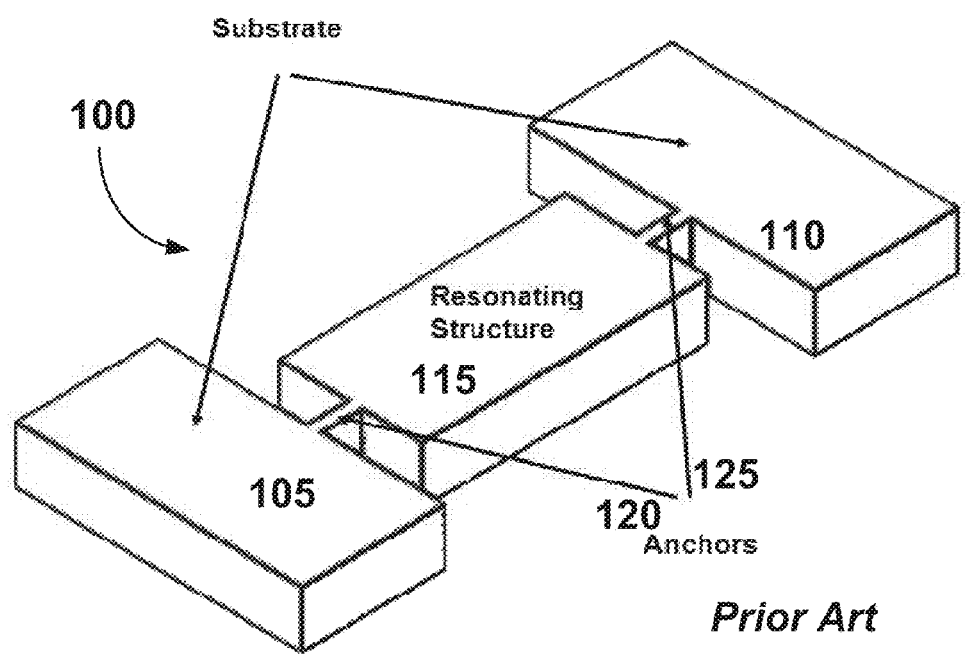
FIG. 1 *Prior Art*
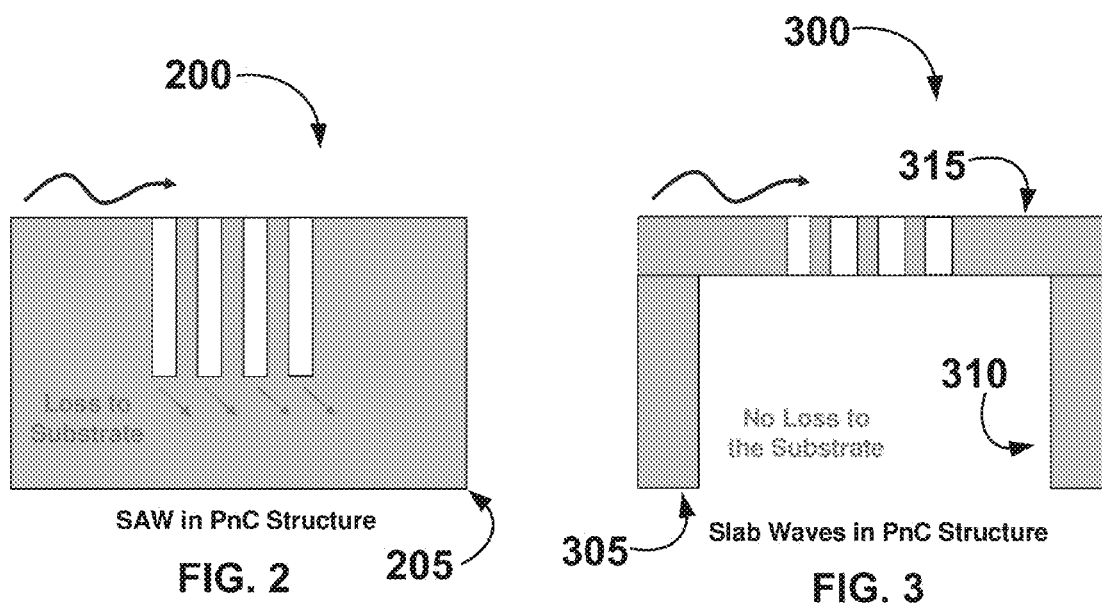
FIG. 2
FIG. 3

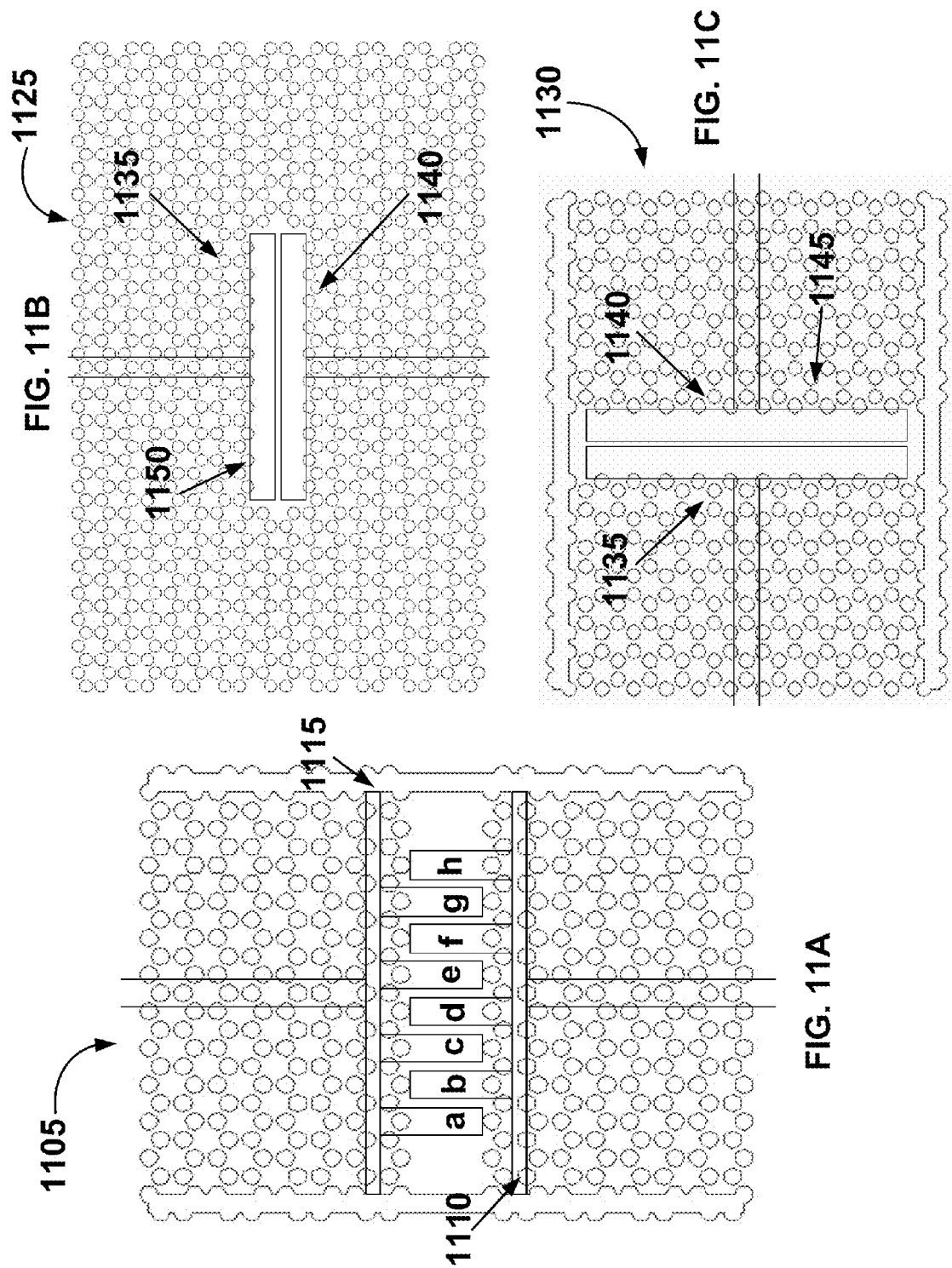

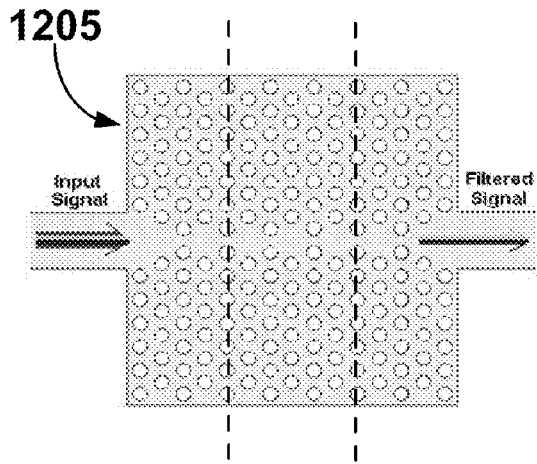
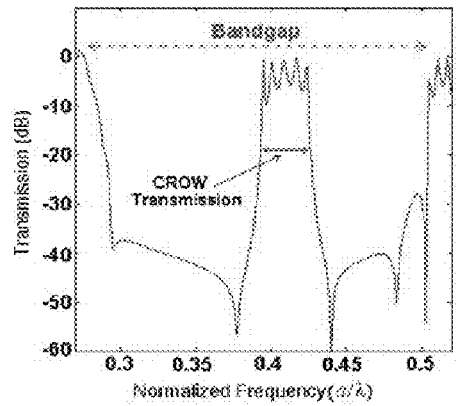
FIG. 12A
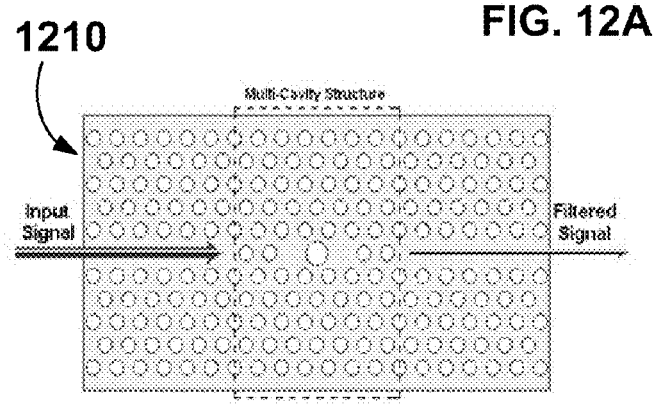
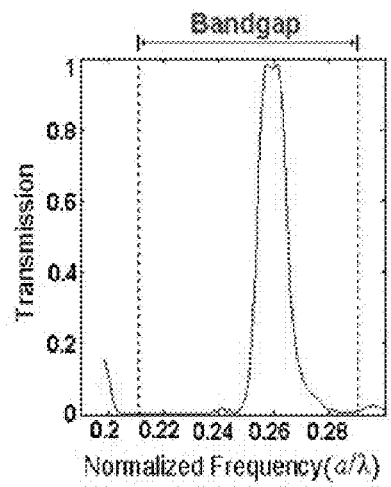
FIG. 12B
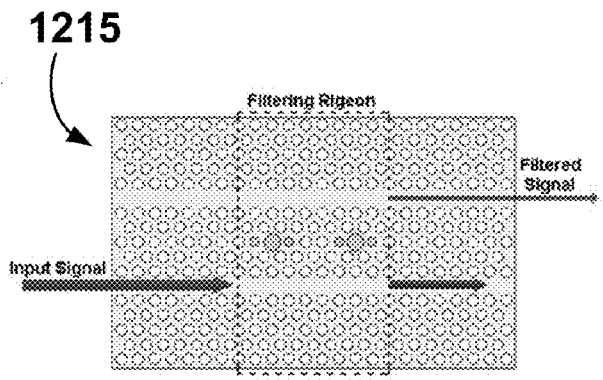
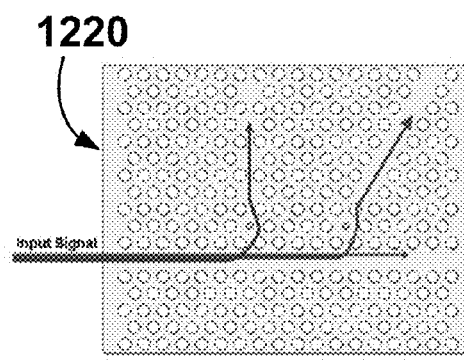
*a*  *b*
FIG. 12C

F = 126.6MHz
Q > 6300

F = 149.1 MHz
Q > 2100

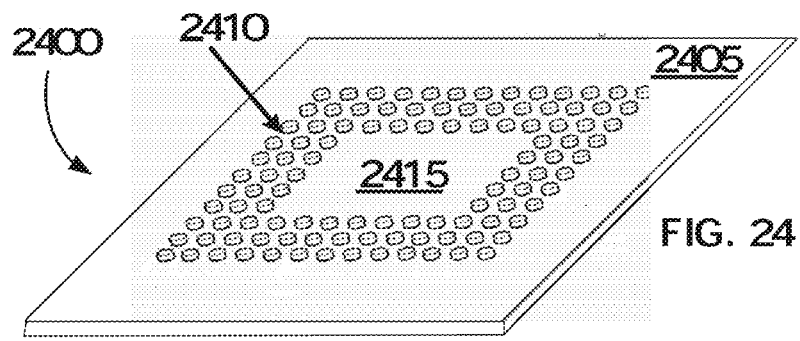
FIG. 24
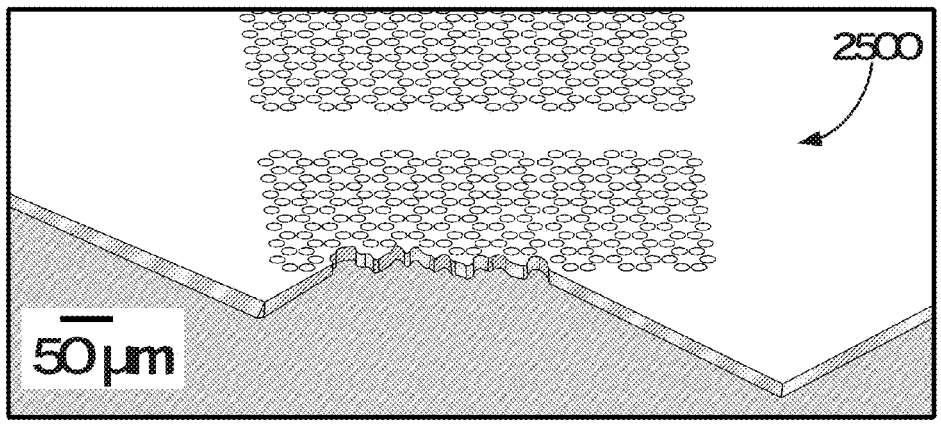
FIG. 25A
$a = 15\mu m, r = 7\mu m, d = 15\mu m$
FIG. 25B
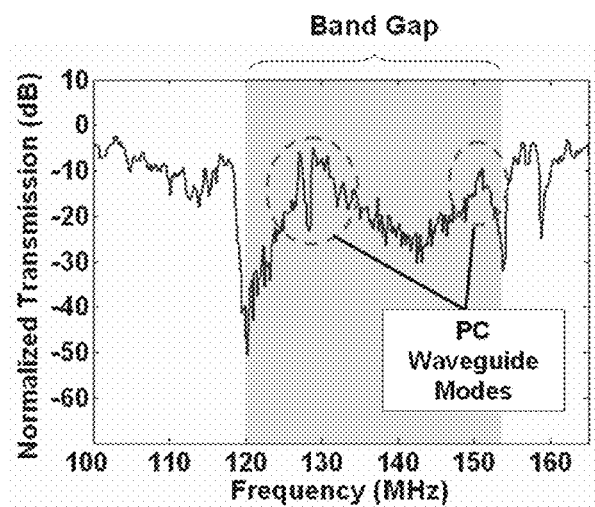

PHONONIC CRYSTAL WAVE STRUCTURES

CROSS REFERENCE TO RELATED APPLICATIONS & PRIORITY CLAIM

This application claims priority to and the benefit of United States Provisional Patent Application No. 61/049,003, filed 30 Apr. 2008, which is incorporated herein by reference in its entirety as if fully set forth below.

FEDERALLY SPONSORED RESEARCH STATEMENT

The embodiments of the invention claimed and described herein were made with partial Government support from the National Science Foundation (Contract Number ECS-0524255) and the Office of Naval Research (Contract Number N00014-05-1-0303.X.). The United States Government may have certain rights to the inventions claimed and described in this patent application.

TECHNICAL FIELD

Embodiments of the present invention relate generally to phononic crystal structures and more specifically to phononic crystal, micro/nano-mechanical and acoustic devices configured to conduct and entrap mechanical and acoustic energy (e.g., waves) for a variety of applications as discussed herein.

BACKGROUND

In the wide market of consumer electronics and the growing market of sensing devices, there is a demand for high quality factor (Q) micro/nano-mechanical devices. These devices can be used as building blocks for a variety of devices such as filters, frequency references, and mass sensors in such applications as wireless communication and sensing.

While serving their purpose, there are several loss mechanisms that limit the quality factor of conventional micro/nano-mechanical acoustic devices. In the current conventional designs of micro/nano-mechanical devices, substrates are not completely isolated from a vibrating medium. Indeed, the resulting structure includes a vibration medium (or resonating structure) that is anchored to the substrate. This anchoring configuration results in a loss or attenuation of mechanical energy due to the mechanical link. Although attempts have been made to reduce the loss of mechanical energy through these anchor points, this loss cannot be eliminated completely through conventional methods.

What is needed, therefore, are improved micro/nano-mechanical acoustic devices and associated manufacturing methods capable of providing high quality devices. It is to the provision of such devices, systems, and methods that embodiments of the present invention are directed.

SUMMARY OF EXEMPLARY EMBODIMENTS

Embodiments of the present invention are generally directed to phononic crystal wave structures. Phononic crystal wave structure can be configured for use in a wide variety of applications, including, but not limited to sensors and electronic devices for radio frequencies (RF) such as resonators, multiplexers, de-multiplexers, filters, frequency reference devices, oscillators, delay lines, phase shifters, and couplers. Numerous of these applications can also be used for wired and wireless communication systems and sensing systems. Embodiments of the present invention utilize various properties of phononic crystals (e.g., phononic band gaps, small size, and low loss material) to address the issues discussed above as well as others that conventional devices posses. Several exemplary embodiments of the present invention are discussed in this section and additional embodiment and feature details are discussed throughout this patent application.

Generally described, embodiments of the present invention include a micro/nano-mechanical acoustical device. An acoustical device can generally comprise a phononic crystal slab. The phononic crystal slab can be configured as an micro/nano-acoustical wave medium. The phononic crystal slab can define an exterior surface that bounds an interior volume. The phononic crystal slab can be sized and shape to contain acoustical waves within the interior volume of the phononic crystal slab. The phononic crystal slab can comprise at least one defect portion that affects periodicity characteristics of the phononic crystal slab. The defect portion can be shaped and arranged to enable confinement of acoustical waves through the defect portion of phononic crystal slab.

In other embodiments, the present invention can include an acoustical wave system for use with wireless communication systems. The acoustical wave system can generally comprise a phononic crystal acoustic wave medium. The phononic crystal acoustic wave medium can be disposed between an input transducer and an output transducer. The acoustical wave medium can be enabled to allow acoustic waves to propagate between the transducers. The input transducer can be configured to excite the acoustic wave medium and the output transducer can be configured to receive acoustical wave excitation energy. The acoustic wave medium can comprise a plurality of phononic crystal plate sections, each containing a multi-dimensional periodic array of inclusions. The periodic array of inclusions can be disposed so that only acoustic waves of predetermined frequency or range of frequencies to propagate through the acoustic wave medium. The acoustic wave medium can be sized and shaped to contain acoustical waves within the interior volume space of the acoustic wave medium. Also the acoustic wave medium can comprise at least one defect region disposed among the periodic array of inclusions. The defect region can be capable of allowing acoustic waves to propagate through the defect region.

Still yet other embodiments are directed to a micro/nano-mechanical acoustical device. The device can comprise a slab plate sized and shaped to confine acoustical waves within the interior volume of the slab plate. The slab plate can comprise a phononic crystal region and a non-periodic region. The phononic crystal region can be proximately situated to the non-periodic region and configured to bound acoustical waves in the non-periodic region, and the non-periodic region configured to allow the acoustic waves to propagate through the non-periodic region.

Other aspects and features of embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures, all embodiments of the present invention can include one or more of the advantageous features discussed herein. In other words, while one or more embodiments may be discussed as having certain advantageous features, one or more of such features may also be used in accordance with the various embodiments of the invention discussed herein. Also, while exemplary embodiments may be discussed below as device, system, or method embodiments it should be understood that such embodiments can be variously implemented in various devices, systems, and methods.

BRIEF DESCRIPTION OF THE FIGURES

FIG. 1 illustrates a schematic diagram of a prior art acoustic wave device (a resonator) that includes anchors disposed between a resonating structure and opposing substrate components.

FIG. 2 illustrates a schematic representation of a prior art phononic crystal structure for use with transmitting surface acoustic waves (SAW).

FIG. 3 illustrates a general, cross-sectional schematic representation of an acoustic wave device in accordance with some embodiments of the present invention.

FIGS. 11A-11C (collectively FIG. 11) illustrate various schematic diagrams showing various placements of transducers for use with acoustic wave devices in accordance with some embodiments of the present invention.

FIGS. 12A-12C (collectively FIG. 12) illustrate various schematic diagrams showing various arrangements formed with multiple acoustic wave devices in accordance with some embodiments of the present invention. Also illustrated are possible associated frequency response diagrams showing frequency response details for the illustrated devices.

FIG. 24 illustrates a schematic diagram of a acoustic wave resonator device configured with raised pillars in accordance with some embodiments of the present invention.

FIGS. 25A-25B (collectively FIG. 25) illustrate a wave guide acoustic device structure (and associated frequency response chart) in accordance with some embodiments of the present invention.

DETAILED DESCRIPTION OF PREFERRED & ALTERNATIVE EMBODIMENTS

Figure 4:
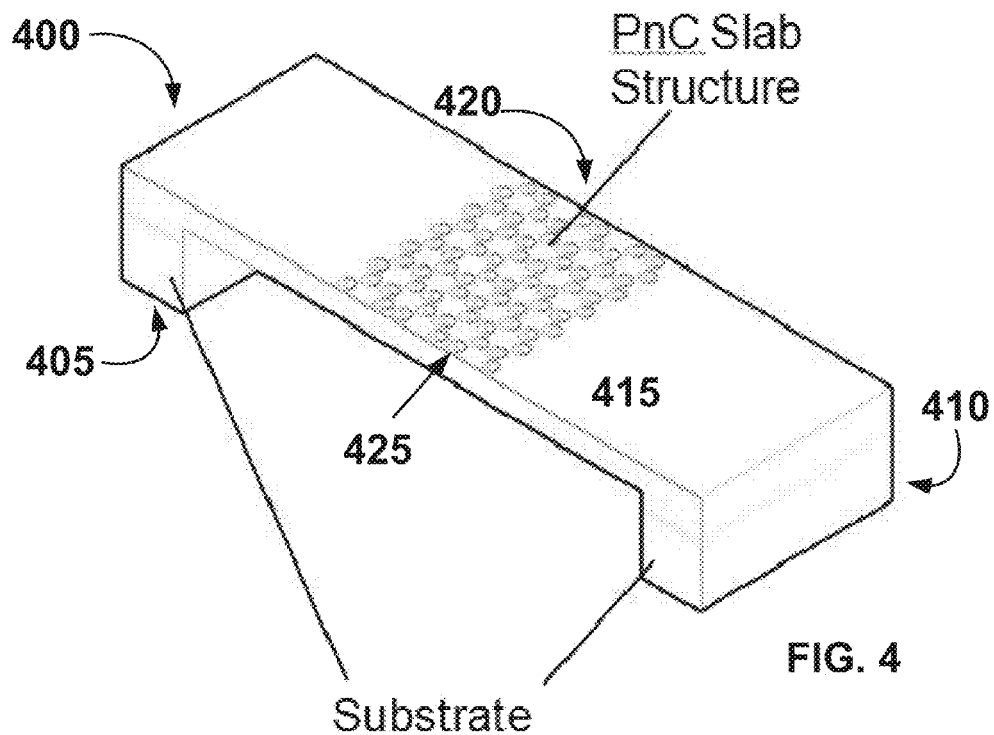
FIG. 4 illustrates a perspective view of a general schematic representation of an acoustic wave device formed with a phononic crystal structure in accordance with some embodiments of the present invention.

To facilitate an understanding of the principles and features of the various embodiments of the invention, various illustrative embodiments are explained below. Embodiments of the present invention are described below for providing phononic crystal devices and associated fabrication methods. Embodiments of the invention, however, are not so limited. Rather, embodiments can include phononic crystal devices with varying physical characteristics that are capable of providing novel and improved micro/nano-mechanical acoustic devices.

Structures with periodic variations in their mechanical properties are known as phononic crystals (sometimes referred to below as "PnCs"). PnCs have unique frequency characteristics not possible to obtain with conventional materials. One interesting PnC property is the possibility of existence of phononic band gaps (PnBGs). PnBGs are frequency bands in which mechanical energy can not propagate through a structure. PnCs with PnBGs can be used to filter, confine, or guide mechanical energy and hence are useful for a variety of applications including, wireless communications and sensing applications. Planar PnCs with two-dimensional periodicity can provide a low-loss platform with flexibility in the fabrication of different lattice types and size and location of periodic inclusions.

Exemplary acoustic devices according to some embodiments of the present invention include a PnC slab. For example in some embodiments, micro/nano-mechanical devices according to the present invention can be resonators that include a phononic crystal slab. PnC slabs can comprise a two dimensional array of inclusions (e.g., holes or raised dots) arranged across the PnC slab. PnC slabs can also have a limited thickness (e.g., on the order of acoustic wavelength). The background environment can be vacuum, air or any other material. The inclusions can be left empty (filled by air or remain in vacuum), or filled with another material. The raised dots can be made of the same material as the slab or a different material with a thickness that can be smaller or larger than the slab thickness. By properly choosing the geometrical parameters of the PnC and the inclusions, it is possible to achieve a phononic band gap (PnBG).

In some embodiments of the present invention, PnC slab structures have a small thickness in one dimension and periodicity applied in the other two dimensions. PnC slab structures can be suspended either in air or vacuum to decouple the modes in the structure from the modes in the supporting substrate or mounted on a substrates of a different material. The PnC slab structure in this case is designed so that the desired acoustic waves in PnC slab does not propagate in the substrate. As a result, PnC slab structures can provide a low-loss and flexible platform to implement functionalities using PnC structures. In currently preferred embodiments, embodiments of the present invention can be fabricated on a Silicon substrate. Embodiments of the present invention can, however, be fabricated with many other materials including, but not limited to, zinc oxide (ZnO), aluminum nitride (AlN), lead zirconate titanate (PZT), quartz, lithium niobate (LiNbO3), lithium tantalite (LiTaO3). Embodiments of the present invention can also be applied to a multi-layer slab created by stacking several layers of different materials with different thicknesses on top of each other.

Referring now to the figures, wherein like reference numerals represent like parts throughout the views, exemplary embodiments of phononic crystal devices are described in detail. FIG. 1 illustrates a schematic diagram of a prior art acoustic wave device (a resonator) 100 that includes anchors disposed between a resonating structure and opposing substrate components. As shown, the device 100 includes two substrates 105, 110 and a resonating structure 115 disposed between the substrates 105, 110. The resonating structure 115 is anchored to the two substrates 105, 110 via two anchors 120, 125. In operation, the resonating structure 115 is excited and mechanical energy is received by a transducer. Due to the resonating structure being anchored to the substrates 105, 110, however, part of the mechanic energy in the device is lost to the device substrate. This results in a less than desired Q factor for the device. Embodiments of the present invention do not utilize anchors and provide resonating structures with increased Q factor ratings relative to the device 100.

FIG. 2 illustrates a schematic representation of a prior art phononic crystal structure 200 for use with transmitting surface acoustic waves (SAW). As shown, the structure 200 includes periodic inclusions proximate a bulk substrate 205 that results in a mechanical energy loss to the substrate 205. The structure's 200 bulky substrate causes the mechanical energy loss and this loss results in a Q factor for the structure that is less than desired. Embodiments of the present invention aim to address this issue and provide devices with increased Q factor ratings relative to the structure 200.

FIG. 3 illustrates a general, cross-sectional schematic representation of an acoustic wave device 300 in accordance with some embodiments of the present invention. As shown, the device generally includes supporting anchors (or supporting pillars) 305, 310 and a membrane 315 supported by the anchors 305, 310. The anchors 305, 310 support the membrane 315 above a void space or empty region 320. Due to the acoustic mismatch between the membrane 315 and the void space 320, there is limited loss of mechanical energy from the membrane 315 to the void space 320. Thus, the device 300 can provide a low-loss and flexible platform to implement desired PnC structure functionalities. Void spaces, such as void space 320, are illustrated in other embodiments shown in the figures. Sometimes such void spaces may be referred to as voids, void regions, empty spaces, or free spaces. In some embodiments, the void space 320 can be filled with one or more other materials. And in some embodiments, the void space 320 may comprise air or be under vacuum so that the membrane 315 interfaces with an empty space below the membrane.

As illustrated, the membrane 315 includes an array of inclusions 325 that give the membrane 315 PnBG characteristics so that only certain acoustic wave frequencies can propagate through the membrane 315. The membrane 315 is preferably an acoustic wave medium capable of allowing acoustic waves to propagate through the membrane 315. According to some embodiments of the invention, the thickness of the membrane 315 is limited relative to its length and width. Using a limited thickness enables acoustic waves to propagate as slab or planar waves through the membrane 315 while being confined within the membrane 315. The general arrangement of the device 300 is in general similar to the other embodiments discussed below so the above details also apply to other embodiments of the present invention.

FIG. 4 illustrates a perspective view of a general schematic representation of an acoustic wave device 400 formed with a phononic crystal structure in accordance with some embodiments of the present invention. As shown, the device 400 can include anchors 405, 410 and a membrane 415. As shown, the thickness of the membrane 415 is limited relative the length and width of the membrane 415. The membrane 415 includes a PnC portion 420 that includes a periodic multi-dimensional array of inclusions 425. In the figure, the inclusions 425 are disposed in a hexagonal lattice array of holes. In other embodiments, the inclusions 425 may be disposed in other geometrical arrangements and can be raised surfaces instead of holes.

The phononic crystal portion 420 can also include other features according to the present invention. For example, the phononic crystal portion 420 may include a defect region (or non-periodic portion) that affects or otherwise disturbs the periodicity of the phononic crystal portion 420. This can be accomplished by implementing a defect at one or more points of the periodic lattice. The defect region can be configured to allow certain acoustic wave frequencies to propagate through the membrane and also to store mechanical energy. By disposing the phononic crystal portion 420 at a central portion of the membrane 415, a utilized defect region can be located intermediate the anchors. In other words, in a membrane central location, the phononic crystal portion 420 does not overlay the anchors 405, 410. This arrangement enables a defect region of the phononic crystal portion 420 to be located away from the anchors. Advantageously this configuration "uncouples" the energy storing defect region away from the anchors which aids in providing a desirable quality factor.

Figure 5:
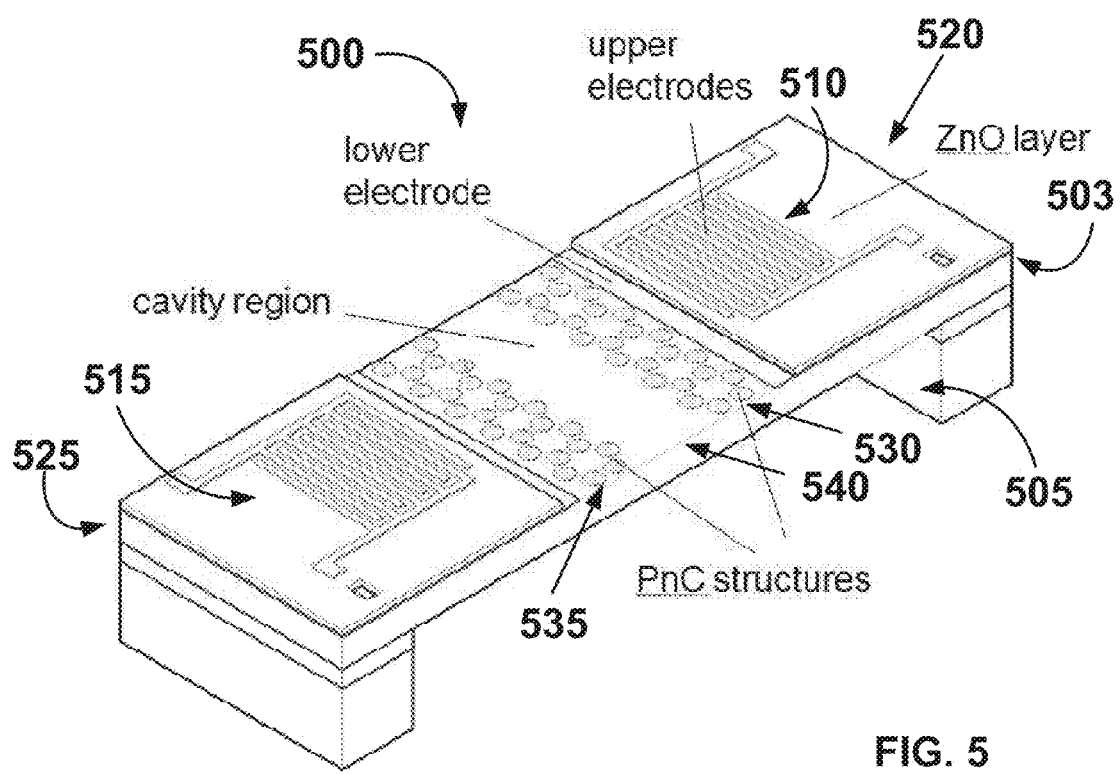
FIG. 5 illustrates a perspective view of schematic representation of an exemplary acoustic wave device formed with a phononic crystal structure and transducers in accordance with some embodiments of the present invention.

FIG. 5 illustrates a perspective view of schematic representation of an acoustic wave device 500 formed with a PnC structure and transducers in accordance with some embodiments of the present invention. The device 500 can be a PnC slab resonator in accordance with some embodiments. The device 500 can generally include a membrane 503 coupled to a substrate on insulator (SOI) wafer 505. The device 500 can also include two opposing transducers 510, 515 on its opposing two sides 520, 525. One of the two transducers can be an input transducer to provide energy to excite the membrane and the other transducer can be an output transducer to receive mechanical energy from the membrane. As shown, the transducers can be located on opposing ends of the membrane. In some embodiments, the device 500 can have a width of approximately 1.2 mm while being configured to transmit acoustic waves having a wavelength of approximately 50 μm. In other embodiments, the PnC can confine acoustic waves ranging from less than the thickness of the membrane to approximately ten times the thickness of the membrane. Still yet, in other embodiments, the phononic crystal slab can have a thickness ranging from less than a wavelength of carried acoustical waves to about ten times the wavelength of the carried acoustical wave.

The device 500 can also include other features as shown. For example, the membrane 503 can include multiple phononic crystal structures 530, 535 and a phononic crystal cavity region 540 disposed between the phononic crystal structures. In this illustrated embodiment, the cavity region 540 is surrounded by four rows of holes (one period of the PnC) on each side. The cavity region 540, also known as a defect region, can be configured to confine, guide, or hold mechanical (acoustic) energy transmitted through the device 500.

Figure 6:
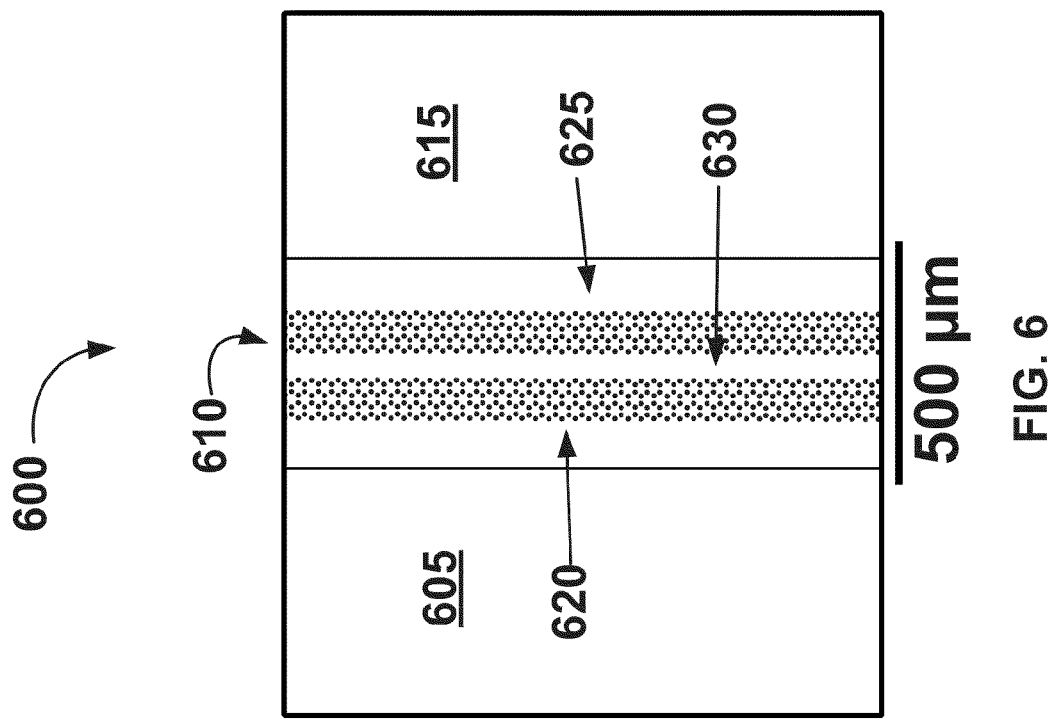
FIG. 6 illustrates a micrograph image of an acoustic wave device (top view) formed with a phononic crystal structure in accordance with some embodiments of the present invention.

FIG. 6 illustrates a micrograph image of an acoustic wave device 600 (top view) formed with a phononic crystal structure in accordance with some embodiments of the present invention. The device 600 embodiment shown in FIG. 6 generally includes an input transducer 605, an acoustic wave medium 610, and an output transducer 615. The acoustic wave medium 610 is preferably configured to allow acoustic waves to propagate as slab waves through the medium 610. For example, the medium can be configured as a slab having limited thickness relative to its length and width. As shown, the medium 610 can have multiple phononic crystal regions 620, 625 and a phononic crystal cavity 630. The phononic crystal cavity 630 can be a defect region in that affects the periodicity of the phononic crystal regions. In this embodiment, the phononic crystal cavity 630 is configured in a linear arrangement. It should be understood, however, that the phononic crystal cavity 630 can have many different shapes or arrangements in accordance with embodiments of the present invention.

Figure 7:
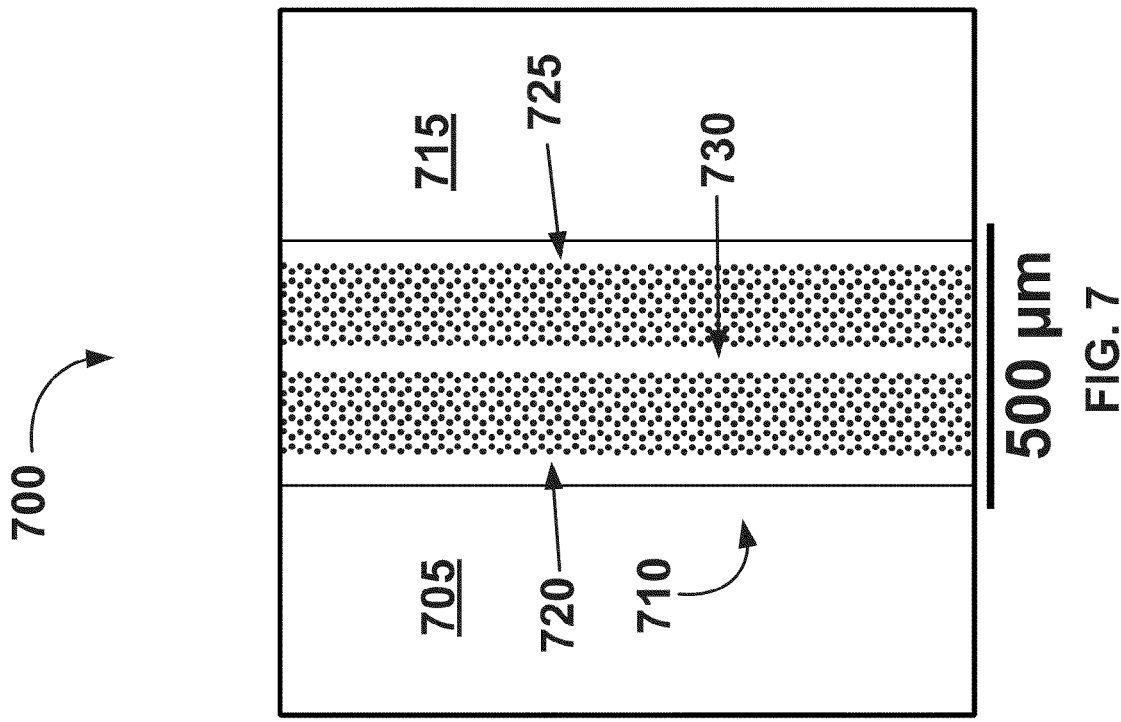
FIG. 7 illustrates another micrograph image of an acoustic wave device (top view) formed with a phononic crystal structure in accordance with some embodiments of the present invention.

FIG. 7 illustrates another micrograph image of an acoustic wave device 700 (top view) formed with a phononic crystal structure in accordance with some embodiments of the present invention. The device 700 shown in FIG. 7 is similar to the device 600 shown in FIG. 6. Indeed, the device 700 generally includes an input transducer 705, an acoustic wave medium 710, and an output transducer 715. The acoustic wave medium 710 is preferably configured to allow acoustic waves to propagate as slab waves through the medium 710. As shown, the medium 710 can have multiple phononic crystal regions 720, 725 and a phononic crystal cavity 730.

One difference between the devices shown in FIGS. 6 and 7 is the configuration of the multiple phononic crystal regions 620, 625, 720, 725. In particular, in the device 700 shown in FIG. 7, the phononic crystal regions 720, 725 have additional rows of periodic inclusions relative to the phononic crystal regions 620, 625. Advantageously, by increasing the number of rows of periodic inclusions, a higher quality factor for acoustic wave devices can result. Thus according to some embodiments of the present invention, the Q factor of an acoustic wave device (e.g., a resonator) is a function of the number of rows of periodic inclusions provided on an acoustic wave medium. In experiments between the devices of FIG. 6 and FIG. 7, the inventors found the device of FIG. 7 had a higher Q factor than that of FIG. 6 due to the additional number of rows of periodic inclusions. These experiments are discussed below in more detail with reference to FIG. 14.

Figure 9:
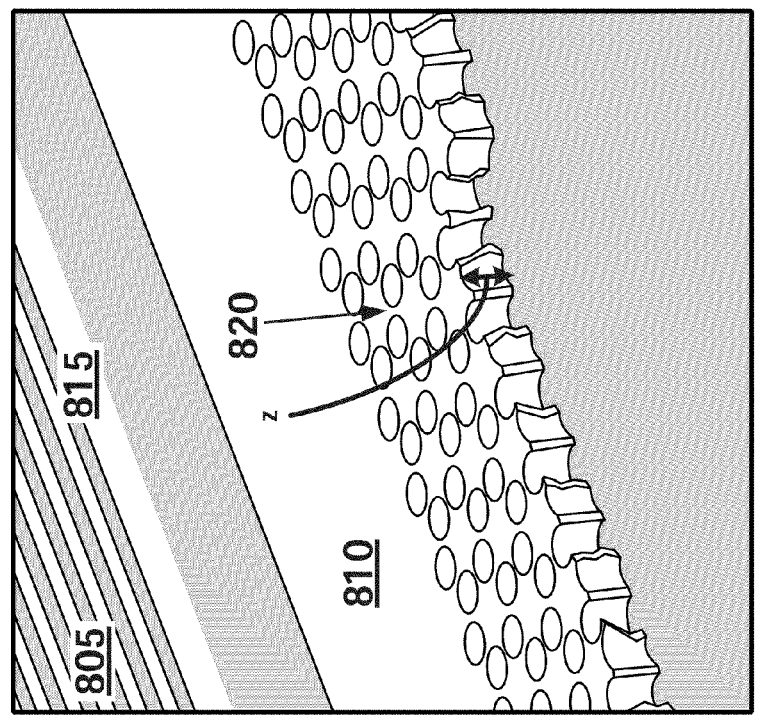
FIG. 9 illustrates a cross-sectional micrograph image of the acoustic wave device illustrated in FIG. 8 and in particular illustrates a cross-sectional view of a phononic crystal lattice structure.
Figure 8:
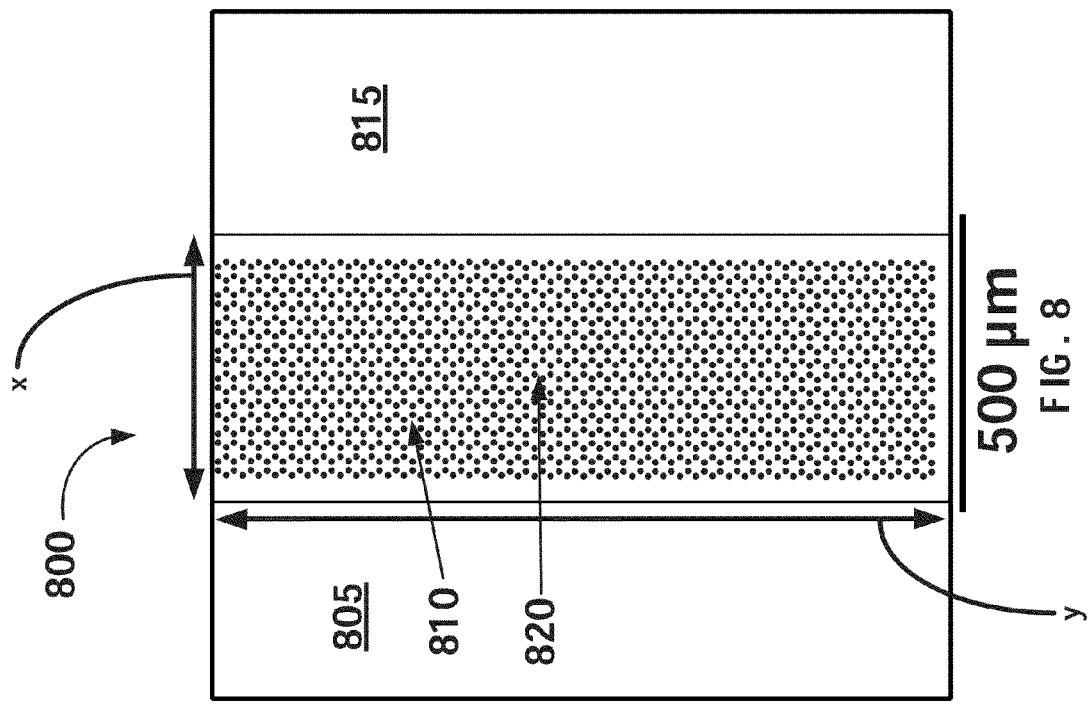
FIG. 8 illustrates yet another micrograph image of an acoustic wave device (top view) formed with a phononic crystal structure in accordance with some embodiments of the present invention.

Turning now to FIG. 8, this figure illustrates yet another micrograph image of an acoustic wave device 800 (top view) formed with a phononic crystal structure in accordance with some embodiments of the present invention. The device 800 generally includes an input transducer 805, an acoustic wave medium 810, and an output transducer 815. The acoustic wave medium 810 is preferably configured to allow acoustic waves to propagate as slab waves through the medium 810. In this embodiment, the acoustic wave medium 810 includes a phononic crystal region 820 that comprises a hexagonal (honeycomb)-lattice structure. FIG. 9 is a cross-sectional micrograph image the acoustic wave device 800, and this figures specifically shows a cross-sectional view of the hexagonal-lattice structure. Also shown in FIG. 9 is a close up view of electrodes forming part of a transducer (which can either be the input transducer 805 or the output transducer 815).

As shown in FIGS. 8-9, the phononic crystal region 820 includes a multi-dimensional array of holes that form the hexagonal lattice structure. The multi-dimensional array yields a periodicity in two dimensions (x and y) as shown in FIG. 8. As shown with reference to FIG. 9, the acoustic wave medium's 810 thickness (or z dimension) is magnitudes less than the acoustic wave medium's x and y dimensions. In accordance with some embodiments of the present invention, the ratio between these magnitudes can range from one to three hundred. It should be understood, however, that device size and dimensions can be tailored upon application requirements and/or specifications.

While the device 800 may be used as an acoustic wave device in some embodiments, in others, the device 800 can be used to modify the phononic crystal region 820. For example, in some embodiments, the phononic crystal region 820 can be modified so that the region includes one or more defects. This modification can produce a defect region. Modification can be done on a specific point basis (e.g., filling or removing, change of size, displacement) in one or more specific holes (or inclusions) in the phononic crystal region) or on a larger scale bases (e.g., filling (or removing, change of size or displacement) in multiple holes) to obtain desired modification results. Modification of the phononic crystal region 820 can result in any formed defect region to be bounded and/or surrounded by the phononic crystal region 820. It should be understood, that while holes are shown in FIGS. 8-9 other types of inclusions (such as holes filled with other materials or materials put on top of the slab) may also be used to create the phononic crystal region 820. It should also be understood that other polygonal geometries (e.g., square-lattice or triangular lattice) can be used to create the multi-dimensional array and lattice structure shown in FIGS. 8-9. It should also be understood that the cross-sectional shape of the inclusions (here circles) can de designed to retain any desired regular or irregular geometrical shape (e.g., circle, square, rectangle, triangle).

Figure 10A:
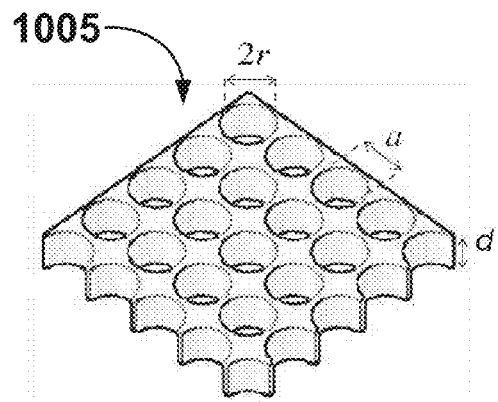
FIGS. 10A-10G (collectively FIG. 10) illustrate various types of multi-dimensional arrays that can be used to form periodic arrangements for phononic crystals in accordance with some embodiments of the present invention.
Figure 10B:
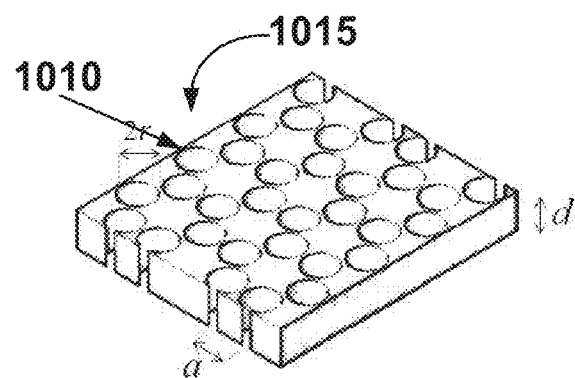
Figure 10C:
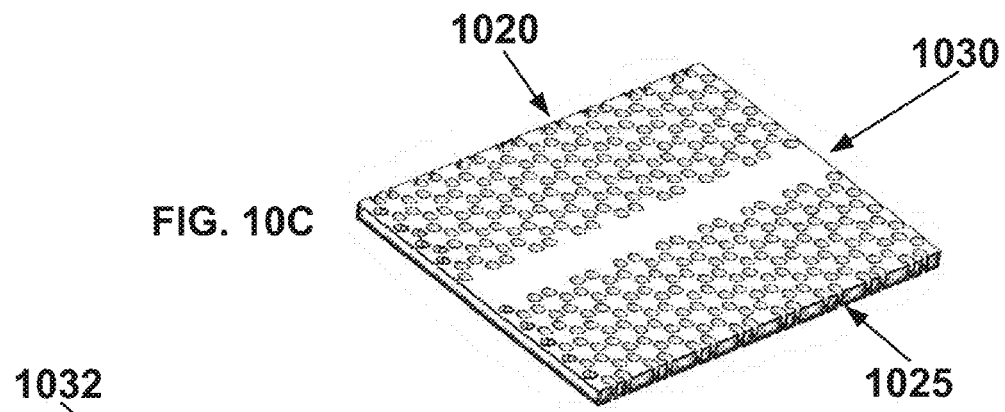
Figure 10D:
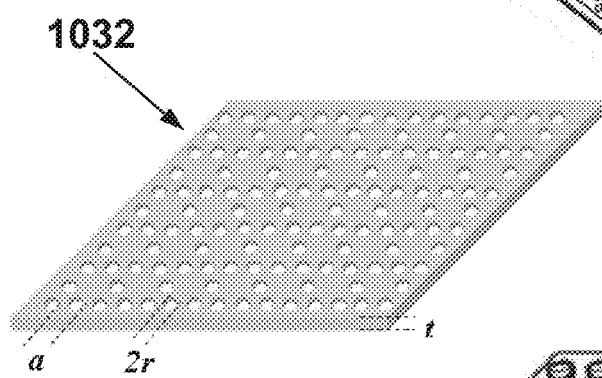
Figure 10E:
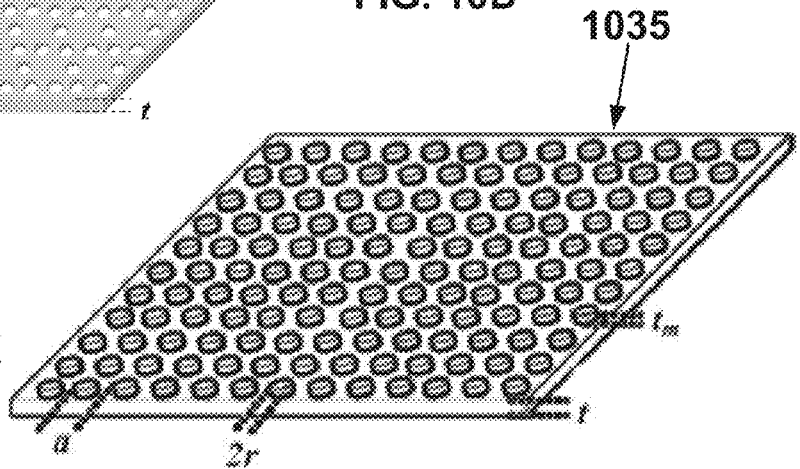

FIGS. 10A-10G (collectively FIG. 10) illustrate various types of multi-dimensional arrays that can be used to form periodic arrangements for phononic crystals in accordance with some embodiments of the present invention. FIG. 10A shows an exemplary multi-dimensional array 1005 of square lattices. Each of the shown squares comprise four holes, and the center of the holes represents vertex points of where sides of the square intersect at square corners. FIG. 10B shows a close up view of a multi-dimensional array 1010 of hexagonal lattices, in which the centers of each hole represent the intersection of hexagon sides. FIG. 10C illustrates a close up view of a phononic crystal slab structure 1015 that comprises a plurality of phonic crystal regions 1020, 1025 separated by a non-periodic region 1030 (or defect region). The phononic crystal slab regions 1020, 1025 are formed with periodic hexagonal lattices (like those shown in FIG. 10B). FIG. 10D shows a close up view of a phononic crystal slab structure 1032 that comprises a plurality of square lattice structures. Shown in FIG. 10E is an arrangement of dots forming an exemplary multi-dimensional array 1035 of triangular lattices.

In some embodiments of the present invention, it may be desired to use dots (which can be raised surfaces) as opposed to holes. Thus, dots (or pillars or pillar sections) can be used to provide a periodic configuration to provide a phononic crystal region in accordance with some embodiments of the present invention. Choosing between holes or raised sections may be based partially on device size and/or manufacturing details.

Figure 10F:
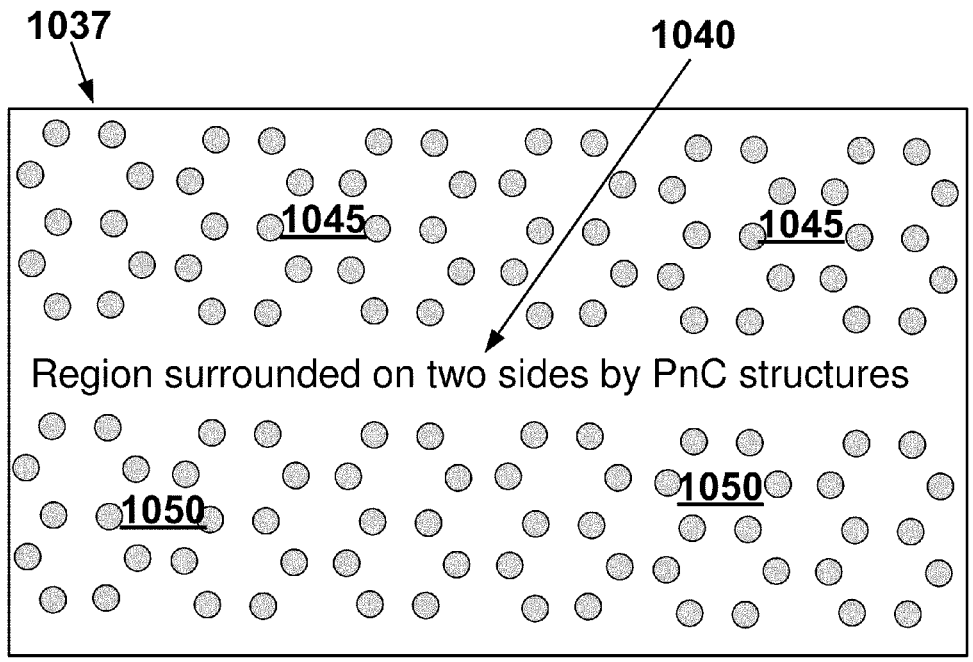
Figure 10G:
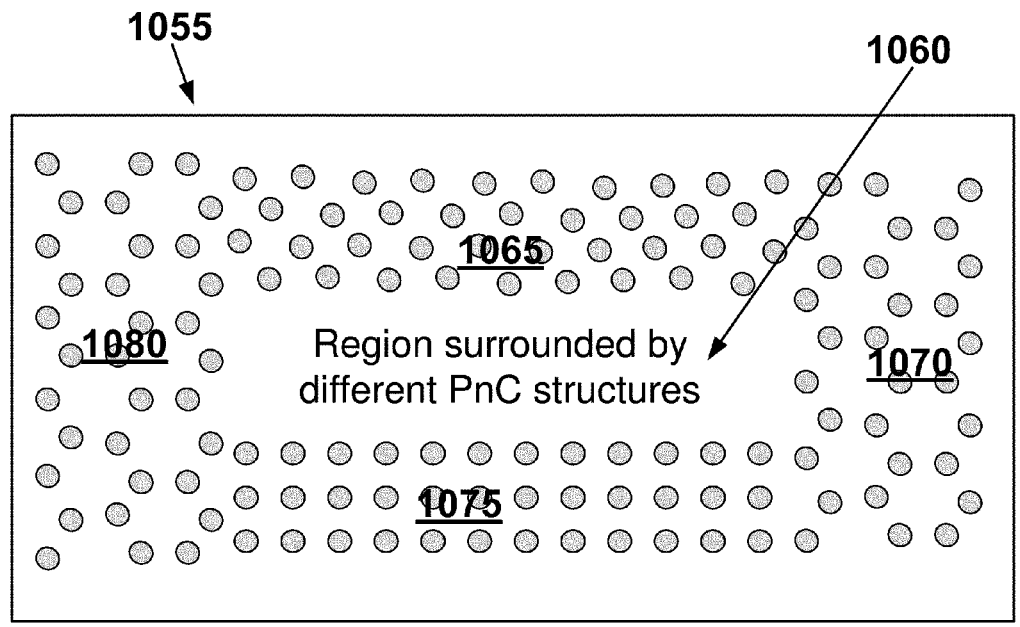

FIGS. 10F and 10G show additional embodiments and manners in which acoustic wave devices of the present invention can be provided. The acoustic wave medium 1037 in FIG.

10F includes a defect region 1040 disposed intermediate two phononic crystal regions 1045, 1050. As is shown, the edges of the defect region 1040 are bounded by the two phononic crystal regions 1045, 1050. In this arrangement, the geometry of the two phononic crystal regions 1045, 1050 can be chosen so that mechanical vibrations are confined with the defect region 1040. In some embodiments, the acoustic wave medium can be used as a waveguide. By providing the defect region in a linear shape such as the defect region 1040, acoustic waves of a certain frequency can be guided by the defect region 1040. Due to the PnBG properties of the two phononic crystal regions 1045, 1050, acoustic waves in a band gap will be prevented from propagating through the two phononic crystal regions 1045, 1050 and thus confined within the defect region 1040. To provide a waveguide embodiment, such as the one shown in FIG. 10F, it may be desired to utilize phononic crystal regions 1045, 1050 having same periodicity characteristics. This way, controlling propagating characteristics of acoustic waves can be accomplished. In other embodiments, it may be desirable to utilize phononic crystal regions 1045, 1050 having varied periodicity characteristics.

In some embodiments, such as the one shown in FIG. 10G, defect regions can be surrounded or enclosed by phononic crystal structures. Such a configuration can advantageously confined mechanical energy vibrations to a specific region in accordance with some embodiments of the present invention. The acoustic wave medium 1055 in FIG. 10G includes a defect region 1060 surrounded by different phononic crystal regions 1065, 1070, 1075, 1080. While illustrated as being surrounded by four different regions, the number of regions can vary according to numerous embodiments. As is shown, peripheral edges of the defect region 1060 are surrounded by the phononic crystal regions 1065, 1070, 1075, 1080. In this arrangement, the geometry of the phononic crystal regions 1065, 1070, 1075, 1080 can be chosen so that mechanical vibrations are confined with the defect region 1060. The phononic crystal regions 1065, 1070, 1075, 1080 can be configured with the same or different periodic characteristics which can in turn affect operational characteristics of the acoustic wave medium 1055 when excited with stimulus.

As discussed above, use of phononic crystals as acoustic wave mediums enables the ability to use PnBGs for a variety of applications. By configuring the geometry of a phononic crystal as desired it is possible to fabricate a phononic crystal wave structure with predetermined band gap behavior. The band gap characteristics are generally a function of inclusion arrangement, inclusion geometry, and phononic crystal substrate geometry. By varying these physical characteristics, desired band gap behavior can be realized.

As one example, consider the multi-dimensional array 1010 comprising several hexagonal lattices. The dimensional references in FIG. 10B are as follows: d is the thickness of the PnC slab; $\alpha$ is the distance between the centers of the nearest holes in the structure; and r is the radius of the holes. Say these parameters are chosen with the following: d=15 µm, $\alpha$=15 µm, and r=6.5 µm. The resulting band structure of the thin PnC slab (calculated using the known plane wave expansion method) provides a large PnBG with frequency extent of 115 MHz<$f$<152 MHz. In other words, by choosing the above dimensions it is possible to control frequencies at which acoustic waves can not propagate through the multi-dimensional array of hexagonal lattices. As a result, such a PnC can be used to confine mechanical vibrations in a wide frequency range.

Mechanical energy can be provided to acoustic wave device in various manners according to embodiments of the present invention. Typically, one or more transducers can be provided to turn electrical energy into mechanical energy to excite an acoustic wave medium. For example, FIG. 6 illustrates electrodes disposed on opposing sides of an acoustic wave medium. As shown, these electrodes are disposed outside of the phonic crystal range of the acoustic wave medium. One of these electrodes can excite the acoustic wave medium and the other can received mechanical energy from the acoustic wave medium in response to the excitation. Other transducer configurations are also possible with the present invention.

FIGS. 11A-11C (collectively FIG. 11) illustrate various schematic diagrams showing various placements of transducers for use with acoustic wave devices in accordance with some embodiments of the present invention. In the embodiments shown in FIG. 11, transducer elements can be disposed in a defect region. In this manner, transducers can supply and receive mechanical energy directly from a defect region. This feature enables provision and reception of acoustic waves direct to a defect region without concern for one or more phononic regions that may bound, enclose, or surround a defect region. This feature can also enable obtaining higher quality factor resonators as more PnC inclusions can be placed around the defect region to achieve stronger acoustic wave confinement. It also leads to lower device input impedances as the coupling of the electrical signals to the resonator modes of the resonator will be more effective in this configuration.

Now looking at the specifics of FIG. 11, these illustrated embodiments show additional features of the present invention. For example, FIG. 11A illustrates an acoustic wave medium 1105 that includes transducers 1110, 1115 having one or more finger elements 1120*a-h* for disposition on a defect region 1115 of the acoustic wave medium 1105. The finger elements 1105 can be overlapped with each other and arranged in an alternating fashion as shown. This transducer configuration can be used to excite a specific mode of the acoustic wave device more efficiently. FIGS. 11B and 11C show other transducer configurations 1125, 1130 in which transducers 1135, 1140 are applied directly to defect regions 1145, 1150 (or cavity regions). It should be understood that the transducer configuration shown in FIG. 11 are just a few alternative transducer embodiments. Thus, it should be understood that transducer configurations can vary and in some embodiments be based on resonator mode shape as well as other operating characteristics.

The above discussion of acoustic wave devices has for the most part focused on single-stage devices. But the embodiments of the present invention are not so limited. Indeed, in accordance with some embodiments, multi-stage acoustic wave devices can be comprised. In a general sense, multi-stage acoustic wave devices result from the coupling of multiple single-stage acoustic wave devices. By coupling multiple acoustic wave devices together, additional beneficial and operational characteristics can be obtained. FIGS. 12A-12C (collectively FIG. 12) illustrate various schematic diagrams showing various devices formed with multiple acoustic wave devices in accordance with some embodiments of the present invention. Also illustrated are associated frequency response diagrams showing frequency response details for the illustrated devices.

Now turning to the specific details of FIG. 12, FIG. 12A shows multiple devices coupled together to form a filter 1205, FIG. 12B shows another filter comprising multiple coupled devices, and FIG. 12C illustrates a demultiplexer comprising multiple coupled acoustic devices. As illustrated by the vertical dashed lines, FIG. 12A shows a filter device that is formed with a series of coupled resonators. A signal with a variety of frequency components can be cast into the filter, and the coupled acoustic wave devices will filter the desired frequencies. FIG. 12B shows another filter made from coupled single-stage devices that filter desired frequencies and produce another filter profile. FIG. 12C shows a filtering b demultiplexing of signals based on their carrier frequencies using PnC resonators. As is shown by these figures, acoustic wave devices according to the present invention (such as PnC resonators) can be used as building blocks for making filters and demultiplexers. In some embodiments, only one acoustic wave device may be desired.

FIGS. 13A-13E (collectively FIG. 13) illustrate schematic images showing an exemplary logical flow diagram of a method 1300 to fabricate acoustic wave devices in accordance with some embodiments of the present invention. It should be understood that the method 1300 is only one fabrication method and that many others can be implemented in accordance with the many inventive embodiments. It should further be understood that more or less process steps can be added or removed from the method 1300 to fabricate a desired acoustic wave device. For example, the method 1300 sets forth a method to fabricate holes for inclusions and other methods can fabricate dots (or pillars) in an entirely different manner. As another example, the method 1300 can be tailored to make many different types of acoustic devices having differing structural or geometrical characteristics and not just the illustrated acoustic wave device shown in FIGS. 13A-13E.

Figure 13A:
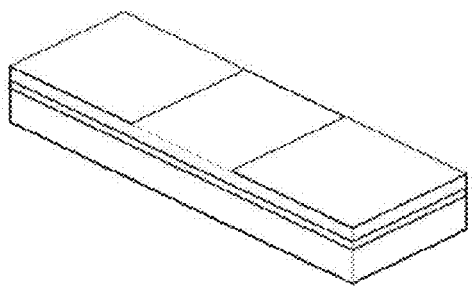
FIGS. 13A-13E (collectively FIG. 13) illustrate schematic images showing a logical flow diagram of a exemplary method of fabricating acoustic wave devices in accordance with some embodiments of the present invention.
Figure 13B:
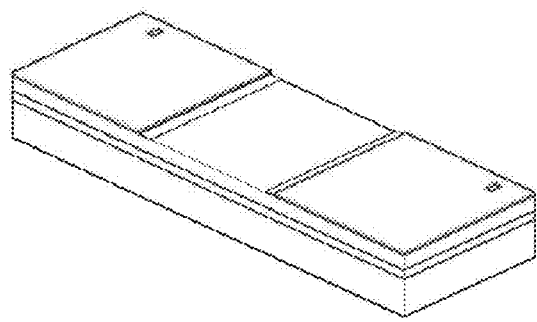
Figure 13C:
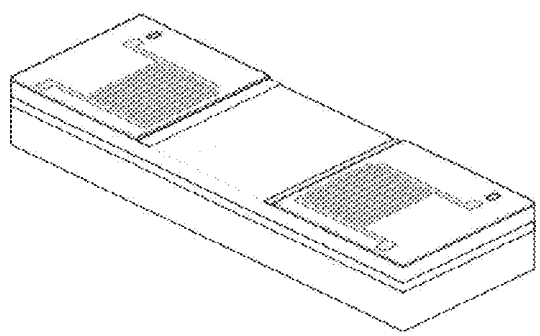
Figure 13D:
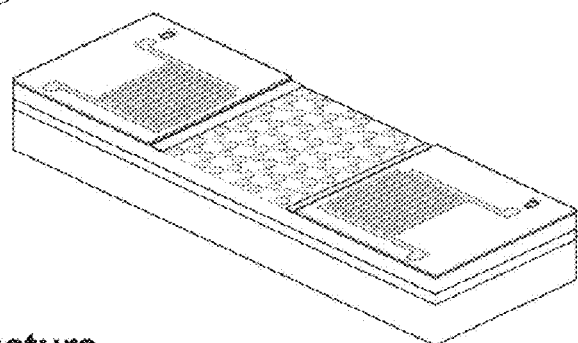
Figure 13E:
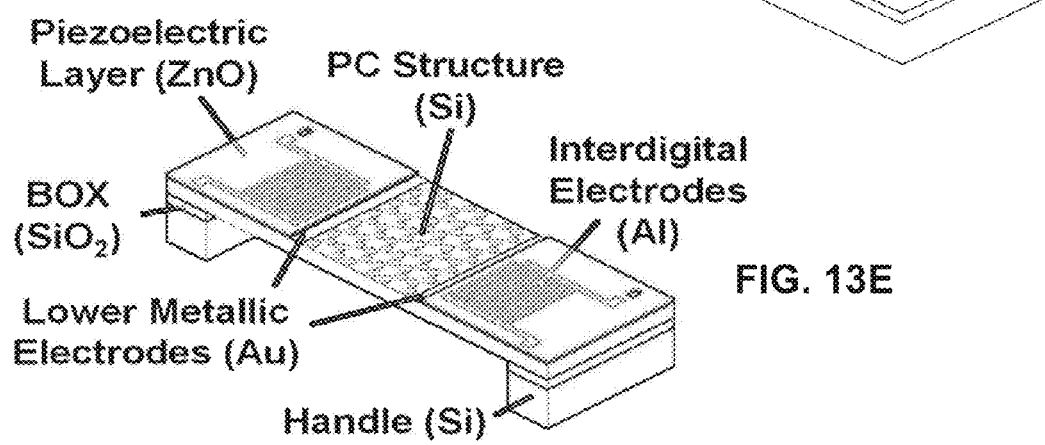

The process 1300 can be initiated by providing a silicon-on-insulator (SOI) substrate as shown in FIG. 13A. In some embodiments, the silicon device layer can have a thickness of 15 μm. Next at FIG. 13B, a thin layer of gold (e.g., ~100 nm) can be evaporated and patterned to form electrodes for device transducers. Gold can be used because it provides an appropriate platform for deposition of a piezoelectric zinc oxide (ZnO) layer. In a next step as shown in FIG. 13C, a thin (e.g., ~1 μm) layer of piezoelectric (e.g., ZnO) can be deposited onto the substrate and patterned using radio frequency (RF) sputtering and wet etching. Then, a second layer of metal (e.g., Aluminum) can be patterned to form a second set of electrodes for the transducers as shown in FIG. 13D. Next, and as illustrated in FIG. 13 E, fabrication can continue by patterning and etching PnC holes through the Si layer. This can be done using optical lithography followed by deep plasma etching. Finally the lowest substrate and the insulator (e.g., the oxide) layers can be etched away as shown in FIG. 13E. This etching forms a PnC membrane and appropriate transducers on the two sides of the resulting acoustic wave device. All of the various mentioned fabrication steps are performed at low temperatures, and can be implemented as post-CMOS processes.

Figure 14:
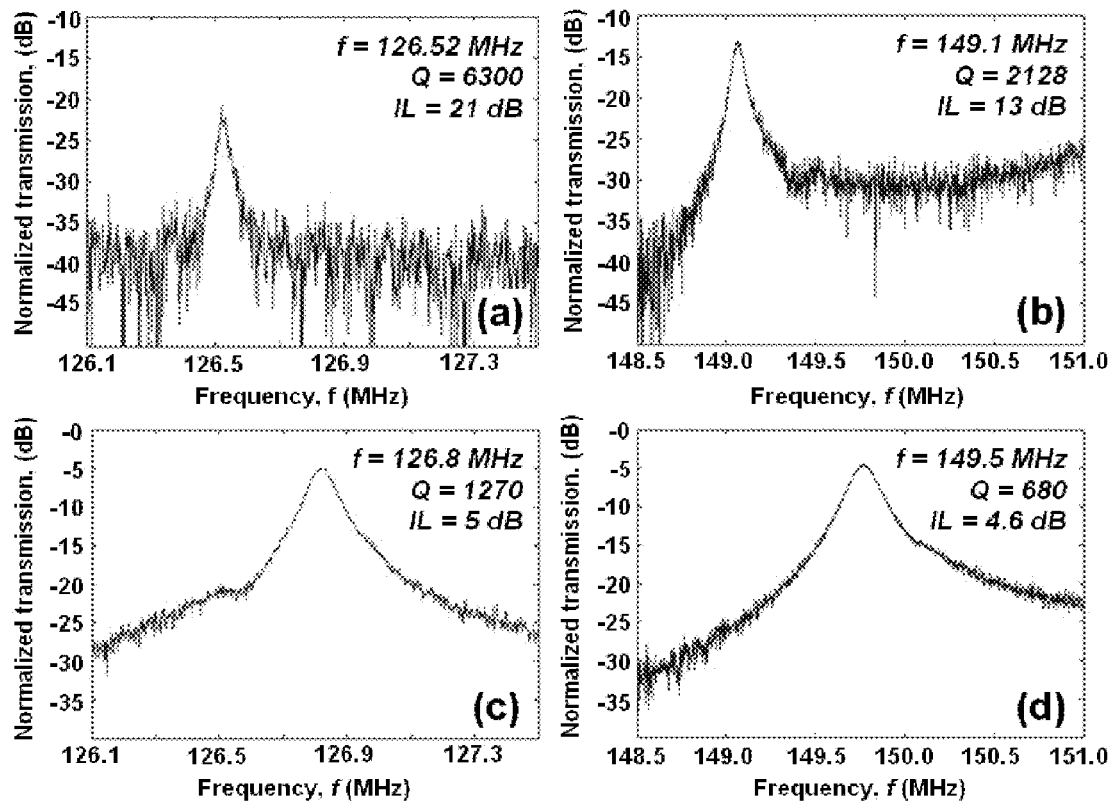
FIG. 14 illustrates a series of frequency response charts depicting experimental results obtained during testing of acoustic wave devices in accordance with some embodiments of the present invention.

FIG. 14 illustrates a series of frequency response charts depicting experimental results obtained during testing of acoustic wave devices in accordance with some embodiments of the present invention. As mentioned above, when discussing FIGS. 6 and 7, the inventors conducted studies of various PnC acoustic wave devices to analyze Q factor changes as a result of physical structure. The graphs illustrate normalized transmission through a PnC cavity slab structure for: (a) first, (b) second studied mode for the structure with three periods (twelve rows) of PnC holes on each side of the cavity, (c) first, and (d) second studied mode for the structure with only two periods (eight rows) of PnC holes on each side of the cavity. The peak frequency (f), quality factor (Q), and insertion loss (IL) are given in each figure.

The normalized transmission profiles at frequencies around the resonance frequencies of these two modes are shown in FIGS. 14(a) and 14(b). As expected, two peaks associated with the two flexural resonant modes of the cavity appear in the transmission spectrum of the flexural waves passing through the PnC structure. A peak in the transmission profile is centered at 126.52 MHz which is in a very good agreement with the predicted resonance frequency of 126.0 MHz of the first studied mode found using FEM. The Q of the transmission profile (and hence the first resonant mode) is 6300 resulting in a frequency by quality factor product (FQP) of $0.8 \times 10^{12}$ Hz which is among the highest FQPs (a common figure of merit for micromechanical resonators) reported to date for Si micromechanical resonators operating at atmospheric pressure.

The measured frequency of the second peak in the transmission is 149.1 MHz, which is again in excellent agreement with the theoretical value of 149.5 MHz found using FEM. The Q of the second resonant mode is measured to be 2128, which is nearly one third of that of the first mode. This is an expected result as the resonance frequency of the second mode is much closer to the edge of the PnBG compared to the first mode.

To evaluate the effect of the number of PnC layers on the Q of the resonant modes of the PnC resonator, we also fabricated the structure with only two periods (eight layers) of holes on each side of the cavity and measured the transmission throughout the PnBG with the same procedure discussed above. The corresponding normalized transmission profiles of the two studied modes are shown in FIGS. 14(c) and 14(d). As it can be seen in FIG. 14, the Q of first and second modes are dropped to 1270 and 680 (as compared to 6300 and 2128 for the previous structure). Reducing the number of PnC layers results in higher coupling of the PnC cavity modes to propagating modes of the Si slab and consequently much lower Qs and lower insertion loss.

Figure 15:
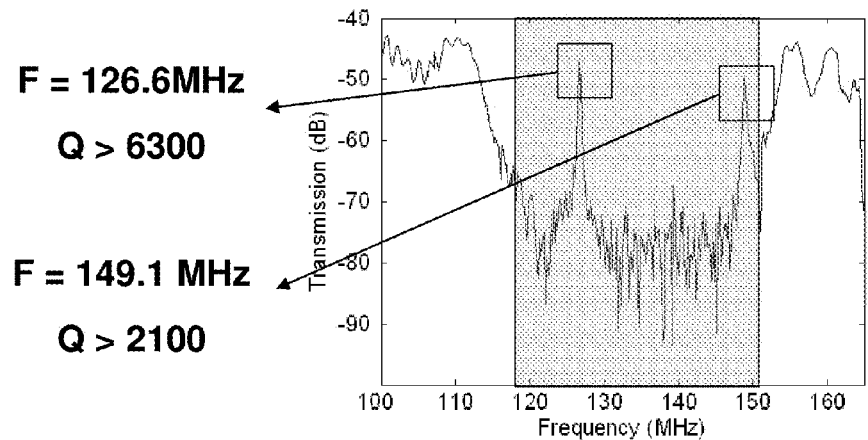
FIGS. 15-16 illustrate a frequency response graph illustrating a phononic band gap of a phononic crystal wave structure in accordance with some embodiments of the present invention.
Figure 16:
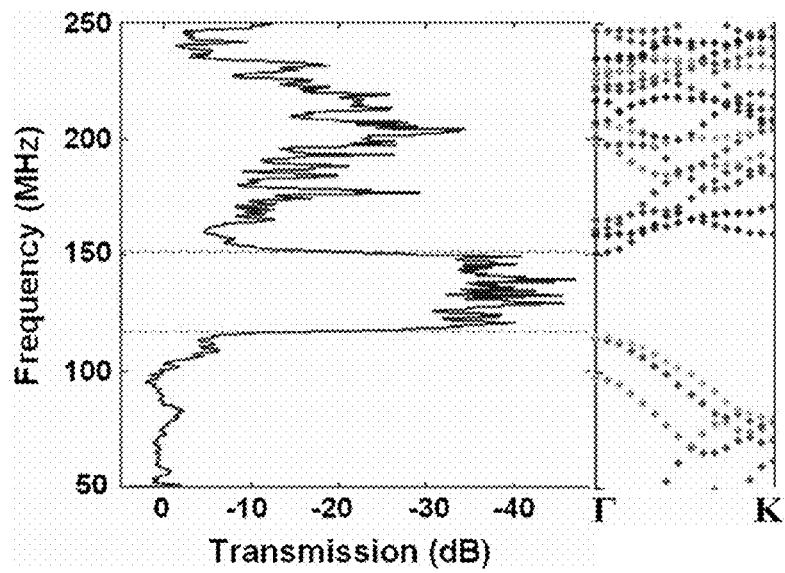
Figure 17:
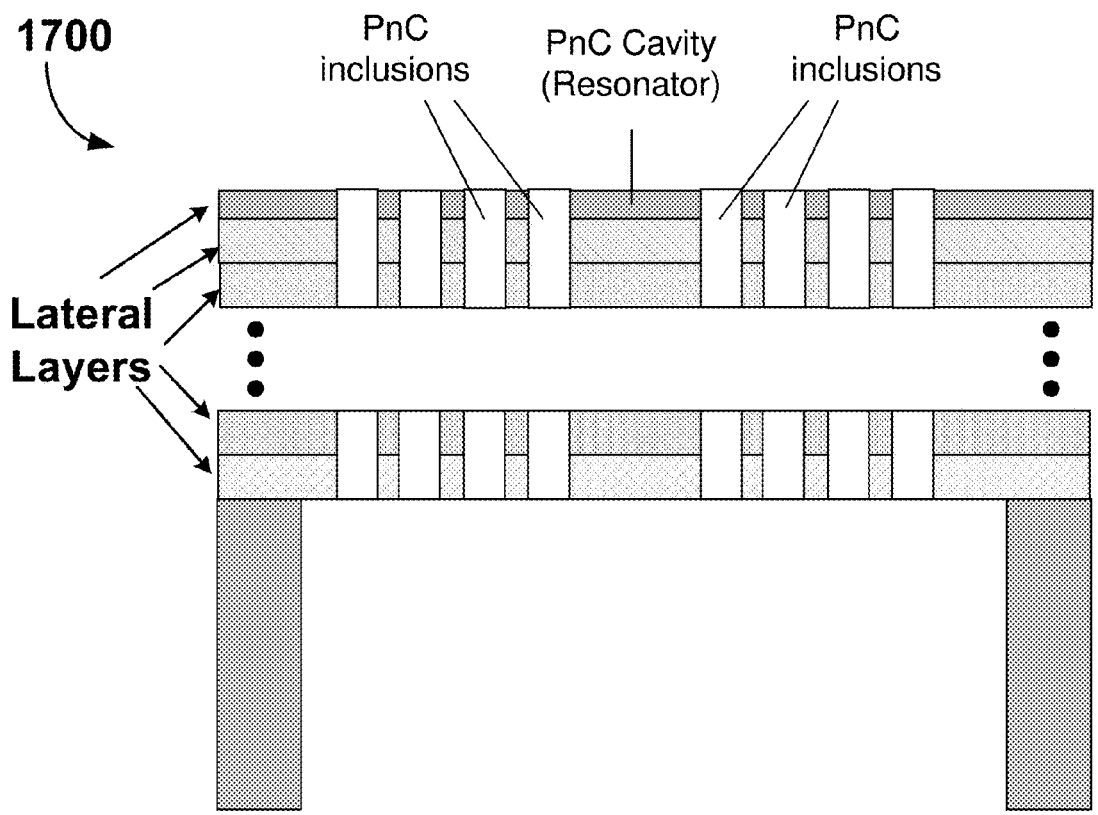
FIGS. 17-20 illustrate yet additional embodiments of phononic crystal wave structures in accordance with some embodiments of the present invention that comprise acoustic wave mediums fabricated with layers of multiple materials.
Figure 18:
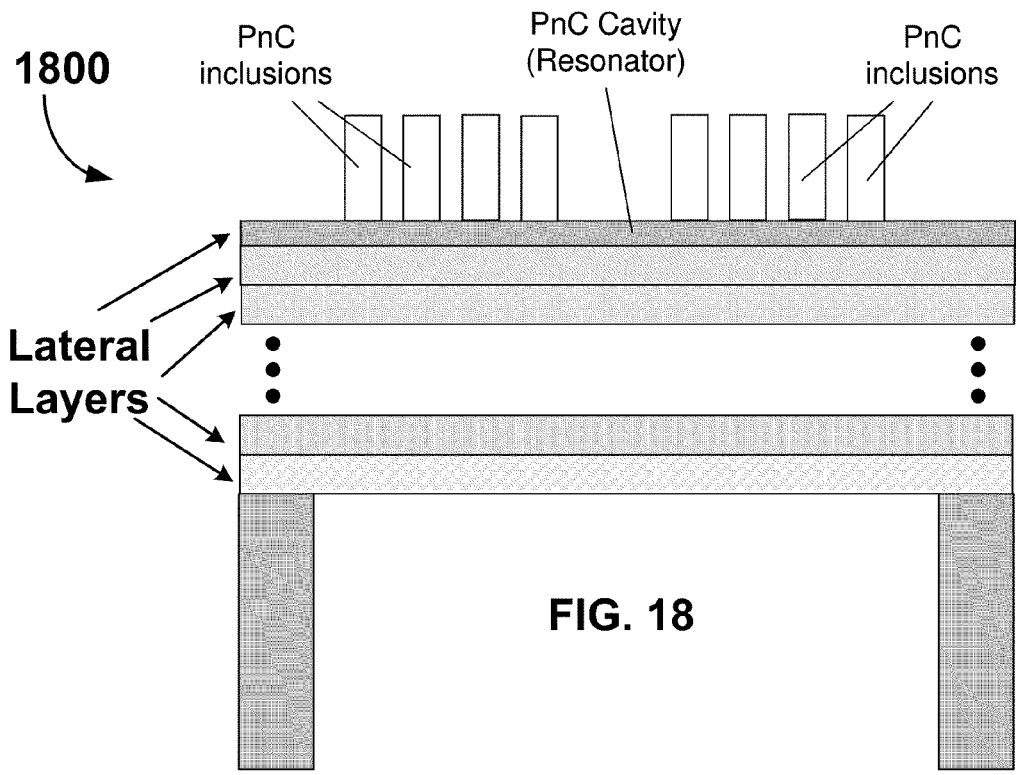
Figure 19:
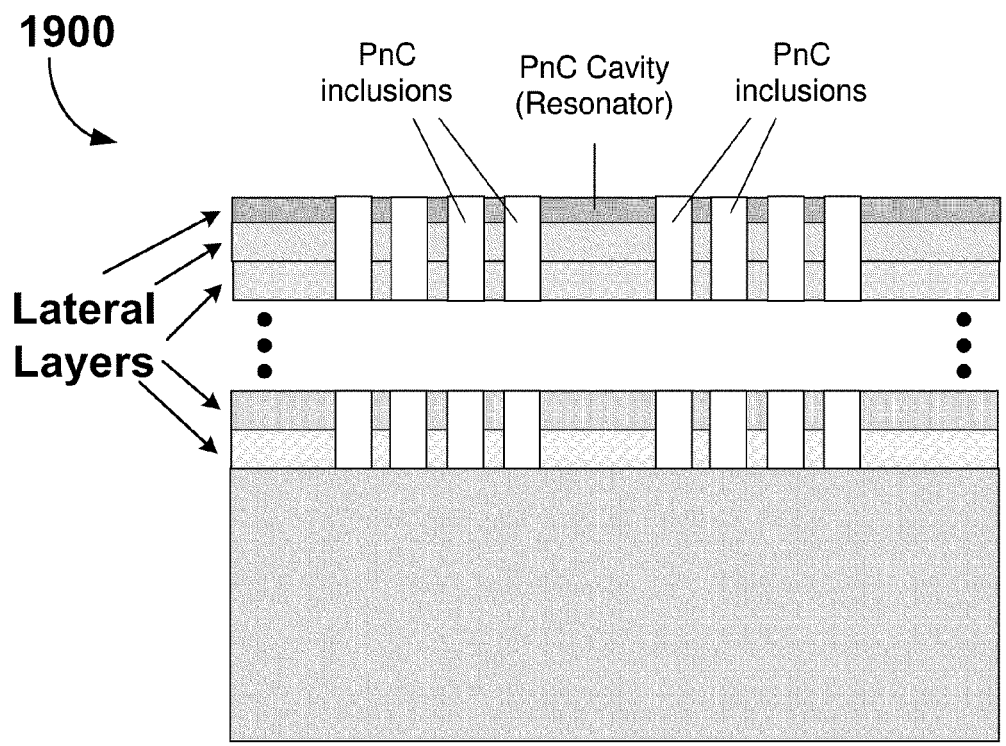
Figure 20:
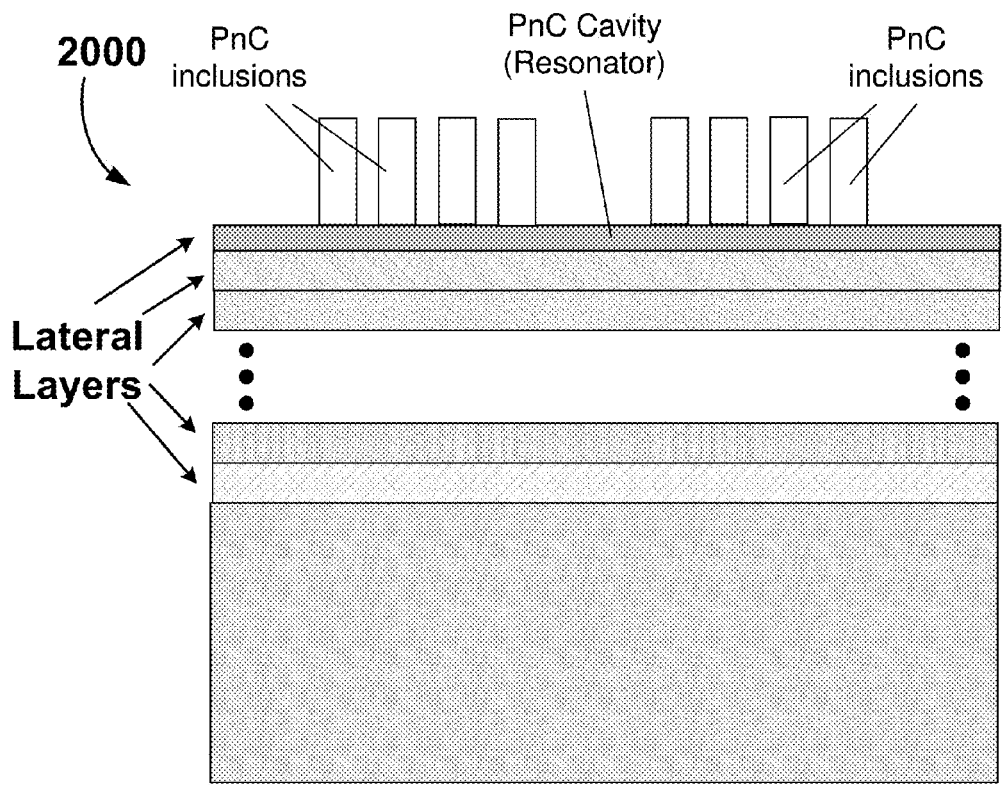

FIGS. 15-16 illustrate a frequency response graph illustrating a phononic band gap of a phononic crystal wave structure in accordance with some embodiments of the present invention. The frequency response shown in FIG. 15 represents the frequency response for the phononic crystal wave structure shown in FIG. 7. As shown, the experimental results show that the device in FIG. 7 has a phononic band gap between about 126 MHz to about 149 MHz. The chart shown in FIG. 16 illustrates that the phononic crystal wave structure shown in FIG. 8 also has a phononic band gap and serves to prove the concept that phononic crystals provide a phononic band gap. As shown, the device in FIG. 8 has a phononic band gap ranging from about 120 MHz to about 150 MHz.

FIGS. 17-20 illustrate yet additional embodiments of phononic crystal wave structures in accordance with some embodiments of the present invention that comprise acoustic wave mediums fabricated with layers of multiple materials. As shown in these figures, devices can be fabricated with vibrating mediums that comprise multiple layers of materials. In addition, these figures show that layered vibrating mediums can also be configured for use with inclusions that are formed with holes or pillars. The layers can be of different or similar thickness. The total thickness of the slab can be less than 10 times the longest wavelength in each material used in the stack of layers. As illustrated, a PnC structure can be provided with a layered slab (plate). The layers can be of different or similar thickness, The total thickness of the slab is less than 10 times the longest wavelength in each material used in the stack of layers.

Figure 21:
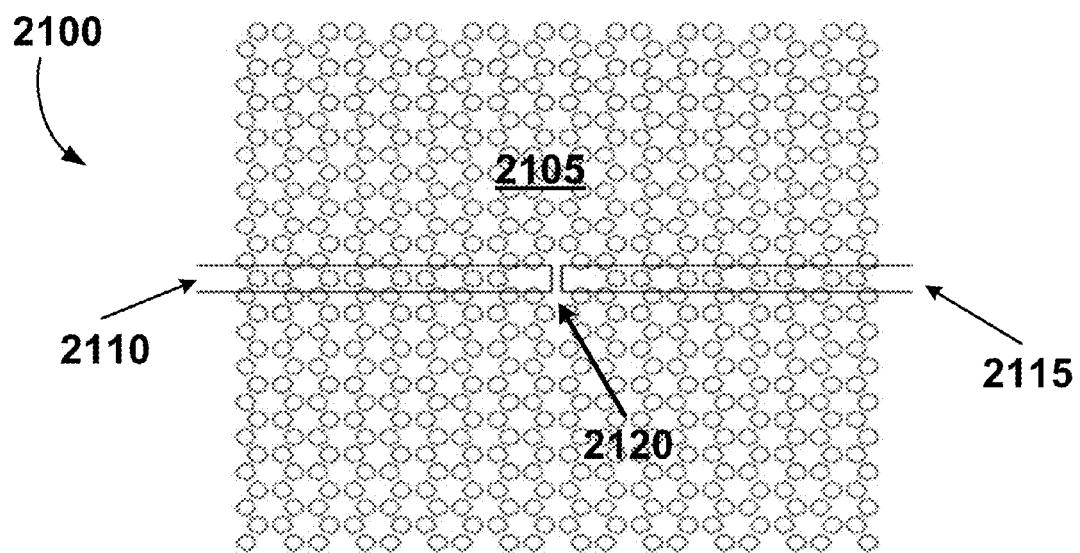
FIGS. 21-23 show schematic illustrations of additional transducer configurations applied to defect regions of limited size in accordance with some embodiments of the present invention.
Figure 22:
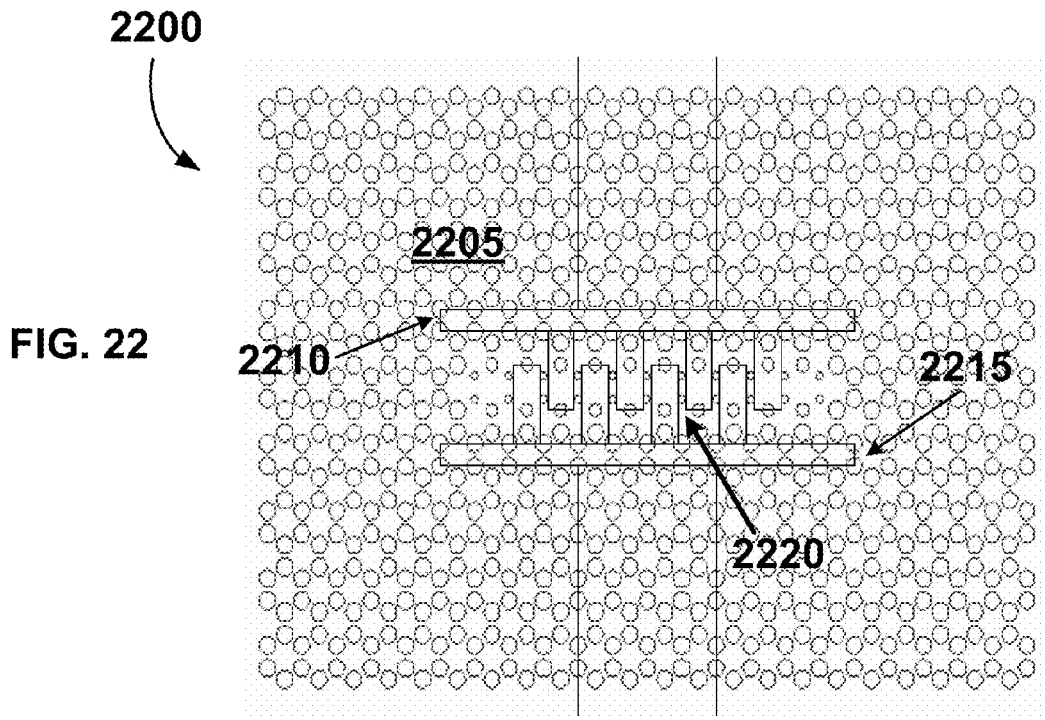
Figure 23:
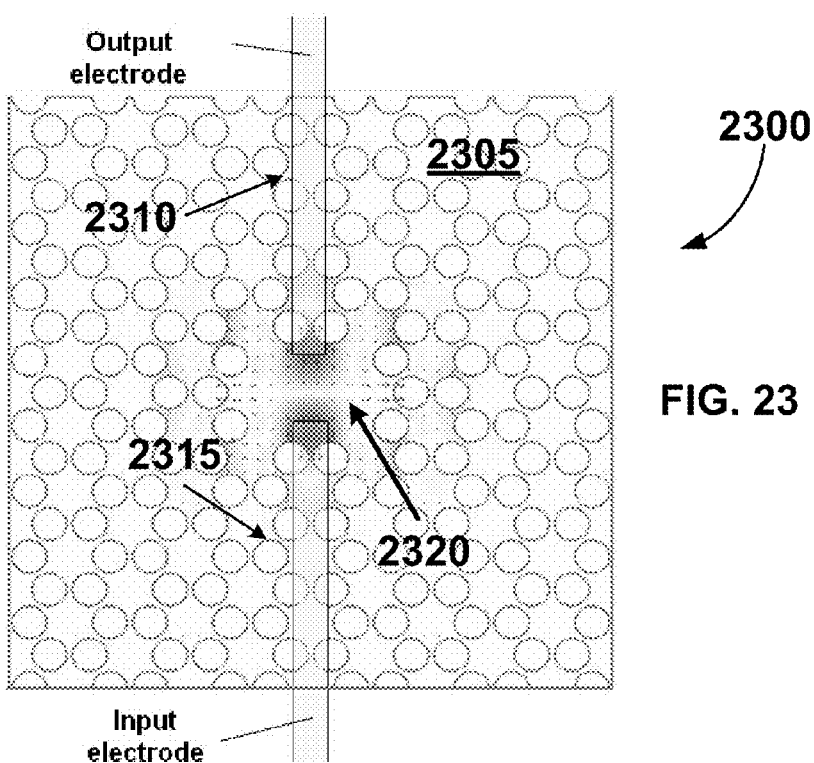

FIGS. 21-23 show schematic illustrations of additional transducer configurations applied to defect regions of limited size in accordance with some embodiments of the present invention. The devices in FIGS. 21-23 are similar to the device in FIG. 11 in that they show multiple transducer configurations so those similar details are not repeated here. FIGS. 21-23 are provided to show that defect regions (or non-periodic regions) can be limited in size. Indeed, defect regions 2120, 2220, 2320 can be provided by only removing or modifying one inclusion to break up inclusion periodicity characteristics of the phononic crystal 2105, 2205, 2305. Also as shown, transducer electrodes 2110, 2115, 2210, 2215, 2310, 2315 can be shaped to excite a certain mode of the resonator.

FIG. 24 illustrates a schematic diagram of an acoustic wave resonator device 2400 configured with raised pillars in accordance with some embodiments of the present invention. The device 2400 generally includes a phononic crystal 2405, an array of periodic inclusions 2410, and a defect region 2415. In this embodiment, the inclusions 2410 are raised surfaces (e.g., pillars) and the inclusions form a square around the defect region.

FIGS. 25A-25B (collectively FIG. 25) illustrate a wave guide acoustic device structure 2500 (and associated frequency response chart) in accordance with some embodiments of the present invention. As shown, the waveguide 2500 includes a linear defect region that can guide acoustic waves between opposing phononic crystal section and between the opposing interdigital electrodes/transducers. The associated frequency chart shows that the waveguide 2500 has a band gap of about 120 MHz to about 154 MHz. This enables the waveguide 2500 to guide waves between this frequency range from one end of the waveguide to the other end of the waveguide.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. A micro/nano-mechanical acoustical device, the device comprising:
a phononic crystal slab configured as an micro/nano-acoustical wave medium, the phononic crystal slab defining an exterior surface that bounds an interior volume, the phononic crystal slab sized and shape to contain acoustical waves within the interior volume of the phononic crystal slab;
wherein a portion of the phononic crystal slab comprises a periodic array of empty inclusions creating a phononic band gap.

2. The device of claim 1, wherein the phononic crystal slab has a thickness ranging from less than a wavelength of the carried acoustical waves to about ten times the wavelength of the carried acoustical wave.

3. The device of claim 1, further comprising opposing end anchors respectively located at opposing ends of the phononic crystal slab to support the phononic crystal slab over a void.

4. The device of claim 1, wherein the phononic crystal slab is a sub-component of at least one of a mechanical resonator, a waveguide, a multiplexer, a demultiplexer and a filter.

5. The device of claim 1, wherein the phononic crystal slab is an unsupported silicon plate and comprises a lattice array of empty periodic inclusions.

6. The device of claim 5, wherein the lattice array of periodic inclusions includes at least one of a triangular lattice, a square lattice, a hexagonal lattice, or a polygonal lattice.

7. The device of claim 1, further comprising a first transducer and a second transducer, both proximately situated to the phononic crystal slab, the first transducer providing the acoustical waves and the second transducer receiving the acoustical waves.

8. The device of claim 1, the phononic crystal slab further comprising at least one phononic crystal plate section that comprises a multi-dimensional array of periodic inclusions.

9. The micro/nano-mechanical acoustical device of claim 1, wherein the phononic crystal slab further comprises at least one defect portion that affects periodicity characteristics of the phononic crystal slab, the defect portion being shaped and arranged to enable confinement of acoustical waves through the defect portion of phononic crystal slab.

10. The device of claim 9, wherein the defect portion is a linear defect region centrally disposed along the phononic crystal slab, the linear defect region ranging from at least one line to a plurality of lines, the linear defect region being straddled by the portion of the phononic crystal slab that comprises the periodic array of empty inclusions.

11. The device of claim 9, wherein the at least one defect portion is arranged as a two-dimensional defect region disposed at a predetermined position along the phononic crystal slab.

12. The device of claim 9, wherein the at least one defect portion ranges from a defect point to a defect region that comprises a plurality of defect points.

13. The device of claim 9, wherein the at least one defect portion comprises at least one of a lack of inclusions, inclusions of different sizes, inclusions of different locations, and inclusions of different shapes.

14. In a communications device capable of receiving data from and transmitting data to another communications device, the communications device comprising an acoustical wave system enabling acoustical waves to pass through the system via a micro/nano-mechanical acoustical device, the acoustical wave system comprising:
a phononic crystal acoustic wave medium disposed between an input transducer and an output transducer, the acoustical wave medium enabled to allow acoustic waves to propagate between the transducers, the input transducer configured to excite the acoustic wave medium and the output transducer configured to receive acoustical wave excitation energy;
the acoustic wave medium comprising a plurality of phononic crystal plate sections each containing a multi-dimensional periodic array of empty inclusions creating a phononic band gap, the periodic array of inclusions being disposed so that only acoustic waves of predetermined frequency or range of frequencies to propagate through the acoustic wave medium;
the acoustic wave medium being sized and shaped to contain acoustical waves within the interior volume space of the acoustic wave medium; and
the acoustic wave medium comprising at least one defect region disposed among the periodic array of empty inclusions, the defect region capable of allowing acoustic waves to propagate through the defect region.

15. The acoustical wave system of claim 14, wherein the acoustical wave system forms at least a part of a resonator or filter component in the communications device.

16. The acoustical wave system of claim 14, wherein the multi-dimensional periodic array of empty inclusions are disposed to form a boundary with the at least one defect region.

17. The acoustical wave system of claim 14, wherein the multi-dimensional periodic array of empty inclusions comprise a series of holes formed on exterior surface of the acoustic wave medium.

18. The acoustical wave system of claim 14, wherein the at least one defect region is a linearly-shaped defect region that is disposed intermediate two multi-dimensional periodic array of empty inclusions.

19. The acoustical wave system of claim 14, further comprising a first anchor and a second anchor, the first anchor located proximate to a first end of the acoustic wave medium and the second anchor located proximate the second of the acoustic wave medium, the first anchor and the second anchors situated beneath an exterior surface of the acoustic wave medium and having approximately equal heights to raise the acoustic wave medium above a void area defined beneath the acoustic wave medium so that the acoustic wave medium forms a membrane supported by the anchors, and wherein the anchors are situated away from the phononic crystal plate sections.

20. The acoustical wave system of claim 14, wherein the plurality of phononic crystal plate sections contain at least one of the same periodicity arrangement, a different periodicity arrangement, and a heterogeneous structure that comprises various materials.

21. The acoustical wave system of claim 14, wherein the phononic crystal acoustic wave medium comprises silicon and the multi-dimensional periodic array of empty inclusions are configured in an at least one of a triangular lattice, a square lattice, a hexagonal lattice, or a polygonal lattice.

22. The acoustical wave system of claim 14, wherein the phononic crystal acoustic wave medium comprises a plurality of layered materials.

23. The acoustical wave system of claim 14, wherein the phononic crystal wave medium is configured to operate in at least one of a low frequency range of frequencies below about 1 megahertz and in a high frequency range of frequencies above about 1 megahertz.

24. The acoustical wave system of claim 14, wherein the input and output transducers are located at least one of proximate the phononic crystal plate sections, proximate the defect region, and on the at least one defect region in an integrated fashion.

25. A micro/nano-mechanical acoustical device, the device comprising:
a slab plate sized and shaped to confine acoustical waves within the interior volume of the slab plate; the slab plate comprising a phononic crystal region and a non-periodic region, the phononic crystal region comprising a periodic array of empty inclusions creating a phononic band gap and proximately situated to the non-periodic region and configured to bound acoustical waves in the non-periodic region, and the non-periodic region configured to allow the acoustic waves to propagate therethrough.

26. The micro/nano-mechanical acoustical device of claim 25, further comprising:
a first anchor and a second anchor respectively disposed at opposing ends of the slab plate, the first and second anchors sized and shape to elevate the slab plate above a void space;
a first transducer and a second transducer, both disposed proximate the slab plate, the first transducer to provide the acoustic waves to excite the non-periodic region and the second transducer to receive acoustic wave energy based on excitation of the non-periodic region; and
wherein the phononic crystal region has multiple lattice periodic arrays that generally bound the non-periodic region.

27. The micro/nano-mechanical acoustical device of claim 25, wherein the periodicity of the phononic crystal region is configured to enable the non-periodic region to resonate at a predetermined frequency or in a predetermined frequency range.

28. The micro/nano-mechanical acoustical device of claim 25, wherein the phononic crystal region comprises phononic crystal structures having varied periodicity characteristics.

29. The micro/nano-mechanical acoustical device of claim 25, further comprising a second slab plate sized and shaped to confine acoustical waves within the interior volume of the slab, the second slab plate coupled to the slab plate enabling the slab plate and the second slab plate to form a multi-stage acoustical wave device.

30. The micro/nano-mechanical acoustical device of claim 25, wherein the phononic crystal region is configured to have periodicity characteristics to control frequency of acoustic waves passing through the slab plate and the non-periodic region.

31. The micro/nano-mechanical acoustical device of claim 25, wherein the non-periodic region is configured to have a linear shape with opposing ends stretching to opposing ends of the slab plate and is disposed intermediate the phononic crystal region.

\* \* \* \* \*